United States Patent [19]
Rennie et al.

[11] Patent Number: 6,060,335
[45] Date of Patent: May 9, 2000

[54] SEMICONDUCTOR LIGHT EMITTING DEVICE AND METHOD OF MANUFACTURING THE SAME

[75] Inventors: John Rennie, Tokyo; Genichi Hatakoshi, Yokohama; Masaaki Onomura, Kawasaki, all of Japan

[73] Assignee: Kabushiki Kaisha Toshiba, Kawasaki, Japan

[21] Appl. No.: 09/020,900

[22] Filed: Feb. 9, 1998

[30] Foreign Application Priority Data

Feb. 12, 1997 [JP] Japan ................................. 9-027749
Feb. 2, 1998 [JP] Japan ................................. 10-020907

[51] Int. Cl.[7] ..................................................... H01L 21/00
[52] U.S. Cl. .................. 438/46; 438/681; 148/DIG. 95; 372/45; 372/46; 372/50
[58] Field of Search ............................... 438/46, 47, 681; 148/DIG. 95; 372/45, 46, 50

[56] References Cited

U.S. PATENT DOCUMENTS

| | | | |
|---|---|---|---|
| 5,426,658 | 6/1995 | Kaneno et al. | 372/46 |
| 5,625,202 | 4/1997 | Chai | 257/94 |
| 5,740,192 | 4/1998 | Hatano et al. | 372/45 |
| 5,793,061 | 8/1998 | Ohuchi et al. | 257/96 |
| 5,866,440 | 2/1999 | Hata | 438/46 |

FOREIGN PATENT DOCUMENTS 9-148626  6/1997  Japan .

OTHER PUBLICATIONS

Shuji Nakamura, et al., "InGaN–Based Multi–Quantum–Well–Structure Laser Diodes," Japanese Journal of Applied Physics, vol. 35, Part 2, No. 1B, (Jan. 15, 1996), pp. L74–L76.

*Primary Examiner*—Wael Fahmy
*Assistant Examiner*—Long Pham
*Attorney, Agent, or Firm*—Oblon, Spivak, McClelland, Maier & Neustadt, P.C.

[57] ABSTRACT

According to the present invention, a high-efficiency and high reliability GaN-based semiconductor light emitting device having uniform light emission from the active layer, can be obtained by suppressing the defect density of the interface between the guide layer and cladding layer. When manufacturing the GaN-based semiconductor light emitting device, the growth temperature and pressure are increased, or the carrier gas flow rate and ammonia flow rate necessary for efficiently growing p-GaAlN are increased, in the vicinity of the interface between the upper p-GaN guide layer and p-AlGaN cladding layer in particular, and thus a method and structure, capable of suppressing these high defect densities generated, can be provided. By selecting appropriate conditions, namely whether the increment in the temperature and pressure, and the increment in the flow rates of the carrier gas and ammonia should be carried out during the growth of the cladding layer or after, or they should be carried out at the same time or independently, or by inserting an InAlGaN or InGaN buffering layer for preventing the generation of defects, between the waveguide layer and cladding layer, the defect densities can be very much decreased.

19 Claims, 11 Drawing Sheets

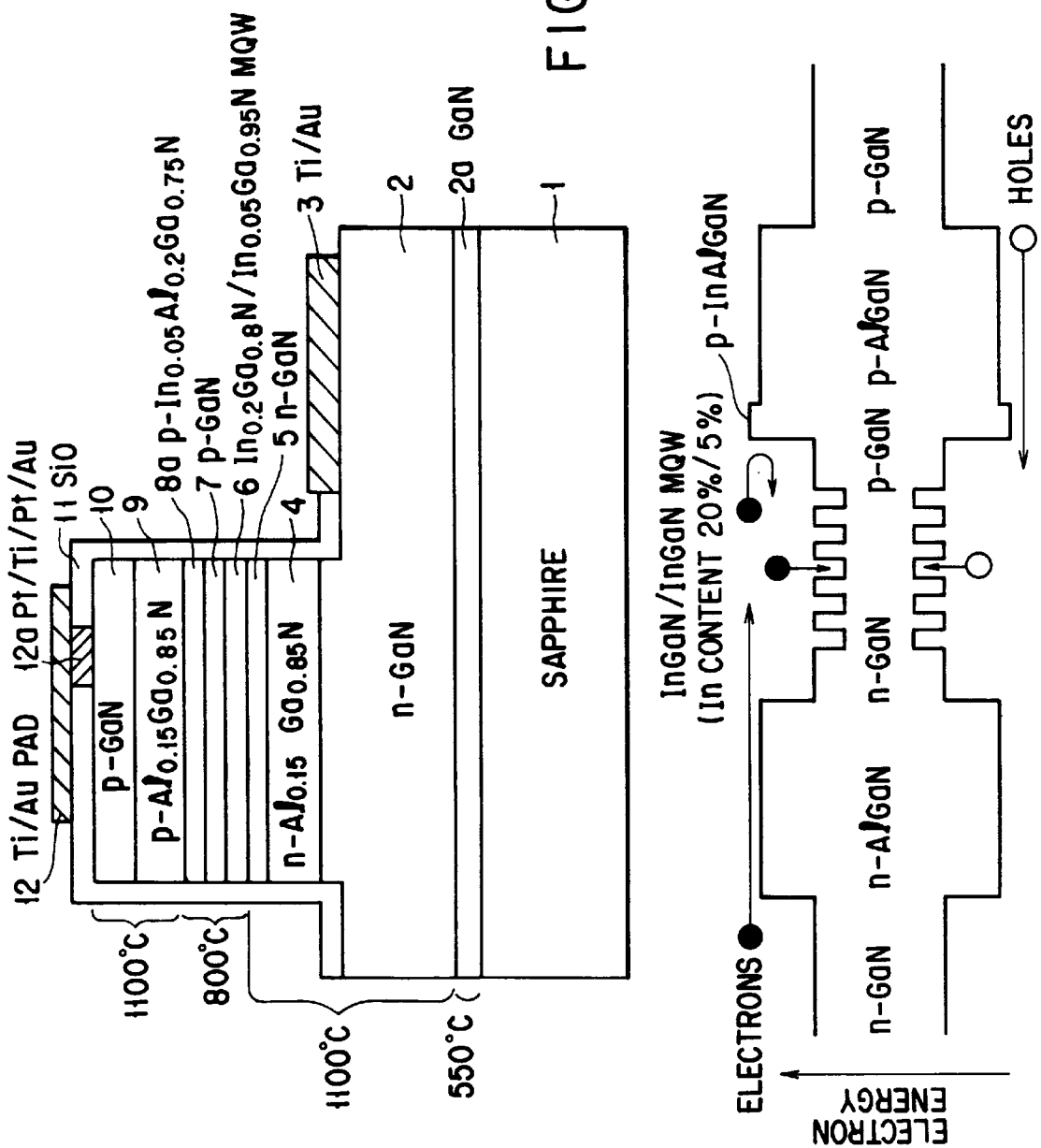

SEMICONDUCTOR LIGHT EMITTING DEVICE AND METHOD OF MANUFACTURING THE SAME

BACKGROUND OF THE INVENTION

The present invention relates to a semiconductor light emitting device and a method of manufacturing such a device, and more specifically to a GaN-based blue-purple semiconductor (to be abbreviated as LD hereinafter) or a GaN-based high luminescence blue-green light emitting diode (to be abbreviated as LED hereinafter).

Recently, GaN-based compound semiconductors such as of GaN, InGaN, AlGaN and InAlGaN are being focused on as materials for blue-purple LD's and high luminescence blue-green light emitting diodes, which are designed to be applied to such applications as high density optical disk systems. In this specification, the suffix indicating the composition of the 3 or 4 element compound semiconductor is omitted unless it is particularly necessary.

In the case where an LD is, for example, used as a light source for an optical disk or the like the shorter its wavelength the greater the size of the focus spot can be reduced. Consequently, the employment of such a short wavelength LD is very effective in achieving a high recording density. However, presently GaN-based LD's, the threshold voltage of operation at room temperature is high as 8V or higher, and further its value is seldom consistent even in samples from the same wafer. Thus, at present, the performance of such an LD is not yet at a satisfactory level for practical use.

Ever since the success in manufacturing p-type GaN (to be called p-GaN hereinafter) by doping with Mg, for the first time, much research has been conducted on various types of lasers of the visible light range from near ultraviolet to blue, with the aim to obtain commercial products. Although a few of these succeeded in the production of laser light emission in a very much limited range, these lasers entail a number of drawbacks still to be solved.

One of the major drawbacks is as follows. That is, in the growth process of a conventional GaN-based compound semiconductor layer, it is inevitable that a great number of defects are produced, and this forestalls a uniform light emission from the active layer.

The cause, for the non-uniformity of the light emission, resides in the fact that the growth temperature for the active and guide layers is in the range 760° C. to 800° C., which is much lower than the growth temperature for the cladding layer adjacent thereto, which is 1100° C., and therefore the growth temperature must be greatly increased at the end of the growth of the active layer and guide layer, that is, before the growth of the cladding layer. When the temperature is thus increased, surface defects, or an interface region containing a great number of defects proliferated from these surface defects, are created.

As a result, an interface region having a high defect density and thus a high resistance as compared to other regions is formed. Therefore, due to the variation in the defect density distribution of the interface region, the current density distribution of the active layer becomes non-uniform, and accordingly the light emitting intensity becomes non-uniform. Such non-uniform light emission causes an increase in the threshold current density and the threshold voltage of the LD operation.

When the growth temperature for the cladding layer is lowered, the creation of such an interface region having a high defect density can be suppressed; however at such a low growth temperature, a p-type cladding layer, which is made of either p-AlGaN or P-GaN having a high doping density and good crystal morphology cannot be obtained. Therefore, when the growth temperature is low, the p-type cladding layer grown on the guide layer has a high resistance and poor crystallinity, thereby greatly increasing the operation voltage of the said LD.

As described above, in conventional GaN-based LD's, the growth of the multilayer structure necessary for forming such a device cannot productively be carried out at a single temperature, and therefore a high resistance region is unfortunately created at a hetero-interface between layers having different growth temperatures. As a result, not only is the series resistance increased but also carriers cannot be uniformly injected into the active layer, and therefore the threshold current and voltage for LD operation are increased. Consequently, an operation voltage much higher than the voltage estimated from the forbidden band width is required.

Thus, in order to realize a high reliability blue-purple LD's and a high luminescence blue-green LED's, both of which are designed for low current and voltage operation, it is important to minimize the resistance of the GaN-based LD or LED and to uniformly and efficiently inject carriers into the active layer.

As described above, in connection with a conventional GaN-based LD or LED, it is very difficult to grow a multilayer structure of a low resistance and a high crystallinity all at a single constant temperature, and therefore, for example, when forming a cladding layer, the temperature condition must be switched at the hetero-interface between the cladding layer and the guide layer. However, when the temperature condition is switched, an interface region having a high defect density is created at the hetero-interface where layers formed at different growth temperatures are formed one on top of the other. As a result, an increase in the resistance and non-uniform carrier injection into the active layer occurs.

BRIEF SUMMARY OF THE INVENTION

The present invention has been proposed to solve the above-described problem, and the object thereof is to provide a high reliability GaN-based semiconductor light emitting device achieving a uniform emission in the active layer, a low threshold current and a low operation voltage, by selecting an appropriate place where the growth conditions are switched, or by inserting a buffer layer into the appropriate position, when the multilayer structure constituting the main portion of a GaN-based semiconductor light emitting device, is formed.

Further, according to the present invention, there is provided a method of manufacturing such a semiconductor light emitting device as described above, without causing defects in the multilayer structure, by switching the growth temperature, pressure, flow rate of carrier gas such as hydrogen or nitrogen, flow rate of ammonia, and the like, at the optimal place and conditions, so as to efficiently grow a p-type cladding layer of a low resistance while forming the multilayer structure of a semiconductor light emitting device.

The semiconductor light emitting device of the present invention is characterized in that it is a structure in which the high defect density region is removed from the hetero-interface into, for example, the cladding layer or the guide layer, thus achieving a high light emission efficiency.

Further, in a semiconductor light emitting device of the present invention, an interface region containing a high defect density is utilized to form the current constriction structure of a GaN-based LD. Further, the present invention is characterized by forming a multilayer structure in which the generation of defects, caused by the switching in the conditions, between the active and cladding regions, such as temperature, flow rate of the carrier gases and the like, is suppressed by growing the cladding layer onto a buffer layer.

More specifically, according to the present invention, there is provided a method of manufacturing a semiconductor light emitting device including at least an active layer, a guide layer and a cladding layer, characterized by comprising the steps of switching the growth temperature or pressure in the growth chamber, from a first temperature or pressure to a second temperature or pressure during growth of the cladding layer made of $In_xAl_yGa_zB_{1-x-y-z}N$ ($0 \leq x, y, z \leq 1$, $0 \leq x+y+z \leq 1$).

There is further provided a method of manufacturing a semiconductor light emitting device characterized by using carrier gases of two mixtures of hydrogen and nitrogen as the first and second carrier gases wherein the second has a low hydrogen content and the first a high one, and by switching the carrier gas during growth from the second carrier gas at a first flow rate to the first at a second flow rate during the growth of the cladding layer made of $In_xAl_yGa_zB_{1-x-y-z}N$ ($0 \leq x, y, z \leq 1$, $0 \leq x+y+z \leq 1$).

There is furthermore provided a method of manufacturing a semiconductor light emitting device, characterized by comprising the step of switching the flow rate of ammonia, which is one of the source gases, from a first flow rate to a second flow rate during growth of the cladding layer made of $In_xAl_yGa_zB_{1-x-y-z}N$ ($0 \leq x, y, z \leq 1$, $0 \leq x+y+z \leq 1$).

There is furthermore provided a method of manufacturing a semiconductor light emitting device, characterized by comprising the steps of switching the growth temperature or pressure in the growth chamber, from a first temperature or pressure to a second temperature or pressure during growth of the guide layer made of $In_xAl_yGa_zB_{1-x-y-z}N$ ($0 \leq x, y, z \leq 1$, $0 \leq x+y+z \leq 1$).

There is further provided a method of manufacturing a semiconductor light emitting device characterized by using carrier gases of two mixtures of hydrogen and nitrogen as the first and second carrier gases wherein the first has a low hydrogen content and the second a high one, and by switching the carrier gas during growth from the first carrier gas at a first flow rate to the second carrier gas at a second flow rate during growth of the guide layer made of $In_xAl_yGa_zB_{1-x-y-z}N$ ($0 \leq x, y, z \leq 1$, $0 \leq x+y+z \leq 1$).

There is furthermore provided a method of manufacturing a semiconductor light emitting device, characterized by comprising the step of switching the flow rate of ammonia, which is one of the source gases, from a first flow rate to a second flow rate during growth of the guide layer made of $In_xAl_yGa_zB_{1-x-y-z}N$ ($0 \leq x, y, z \leq 1$, $0 \leq x+y+z \leq 1$).

There is furthermore provided a method of manufacturing a semiconductor light emitting device, characterized by comprising the step of switching the growth temperature or pressure in the growth chamber from a first temperature or pressure to a second temperature or pressure at the interface between the cladding layer, made of $In_xAl_yGa_zB_{1-x-y-z}N$ ($0 \leq x, y, z \leq 1$, $0 \leq x+y+z \leq 1$), and the contact layer, made of $In_uAl_vGa_wB_{1-u-v-w}N$ ($0 \leq u, v, w \leq 1$, $0 \leq u+v+w \leq 1$).

There is furthermore provided a method of manufacturing a semiconductor light emitting device, characterized by using carrier gases of two mixtures of hydrogen and nitrogen as the first and second carrier gases wherein the first has a low hydrogen content and the second a high one, and by switching the carrier gas from the first carrier gas at a first flow rate to the second carrier gas at a second flow rate at the interface between the cladding layer, made of $In_xAl_yGa_zB_{1-x-y-z}N$ ($0 \leq x, y, z \leq 1$, $0 \leq x+y+z \leq 1$), and the contact layer, made of $In_uAl_vGa_wB_{1-u-v-w}N$ ($0 \leq u, v, w \leq 1$, $0 \leq u+v+w \leq 1$).

There is furthermore provided a method of manufacturing a semiconductor light emitting device, characterized by switching the flow rate of ammonia, which is one of the source gases, from a first flow rate to a second flow rate in an interface between the cladding layer, made of $In_xAl_yGa_zB_{1-x-y-z}N$ ($0 \leq x, y, z \leq 1$, $0 \leq x+y+z \leq 1$), and the contact layer, made of $In_uAl_vGa_wB_{1-u-v-w}N$ ($0 \leq u, v, w \leq 1$, $0 \leq u+v+w \leq 1$).

There is furthermore provided a method of manufacturing a semiconductor light emitting device, characterized by switching the temperature from a first temperature to a second temperature at the interface between the cladding layer, made of $In_xAl_yGa_zB_{1-x-y-z}N$ ($0 \leq x, y, z \leq 1$, $0 \leq x+y+z \leq 1$), and the buffer layer, made of $In_uAl_vGa_wB_{1-u-v-w}N$ ($0 \leq u, v, w \leq 1$, $0 \leq u+v+w \leq 1$), without interrupting the epitaxial growth.

According to the present invention, there is provided a semiconductor light emitting device characterized in that the layer of defects in at least one plane related to the point in growth where a switch between conditions optimum for the active region to that for the cladding region or vice-versa, which is in parallel to the principal plane of the cladding layer made of $In_xAl_yGa_zB_{1-x-y-z}N$ ($0 \leq x, y, z \leq 1$, $0 \leq x+y+z \leq 1$), is positioned within the cladding layer so that there is no such influencial layer of defects in either the interface between the cladding and the guide layers or at the interface between the cladding and the contact layers.

There is further provided a semiconductor light emitting device characterized by comprising of: a current constriction layer made of $In_uAl_vGa_wB_{1-u-v-w}N$ ($0 \leq u, v, w \leq 1$, $0 \leq u+v+w \leq 1$), formed adjacent to the cladding layer made of $In_xAl_yGa_zB_{1-x-y-z}N$ ($0 \leq x, y, z \leq 1$, $0 \leq x+y+z \leq 1$); and a contact layer made of $In_rAl_sGa_tB_{1-r-s-t}N$ ($0 \leq r, s, t \leq 1$, $0 \leq r+s+t \leq 1$) formed adjacent to the current constriction layer, wherein a layer of defects at the interface between the current constriction layer and the contact layer is formed so as to restrict current flow and conversely, in the region through which current will flow, no such influencial layer of defects is formed, parallel to the principal plane.

There is furthermore provided a semiconductor light emitting device characterized by comprising of: a buffer layer made of $In_uAl_vGa_wB_{1-u-v-w}N$ ($0 \leq u, v, w \leq 1$, $0 \leq u+v+w \leq 1$) formed between the active layer and the cladding layer made of $In_xAl_yGa_zB_{1-x-y-z}N$ ($0 \leq x, y, z \leq 1$, $0 \leq x+y+z \leq 1$).

There is furthermore provided a semiconductor light emitting device, characterized in that such a buffer layer is formed between the guide layer and the cladding layer.

There is furthermore provided a semiconductor light emitting device characterized in that the buffer layer serves as a saturable absorption layer in which part of emitted light from the active layer is absorbed by the buffer layer. There is furthermore provided a semiconductor light emitting device, characterized in that the buffer layer serves as a carrier overflow prevention layer for preventing the overflow of carriers injected into the active layer out into the cladding layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 19 is a cross sectional view of a GaN-based semiconductor light emitting device according to the seventh embodiment of the present invention;

FIG. 20 is a diagram showing the energy band structure of the device according to the seventh embodiment of the present invention.

DETAILED DESCRIPTION OF THE INVENTION

The following are detailed descriptions of embodiments of the present invention with reference to accompanying drawings; however in order to clarify the comparison between the embodiments of the present invention and the conventional technique, the control of lattice defects generated during the growth of the multilayer structure of the conventional GaN-based semiconductor light emitting device, will now be described in further detail.

A drawback of the typical conventional GaN-based semiconductor light emitting device, which has a direct connection to the present invention, is that, an interface region having a high defect density is created at a hetero-interface or interfaces in the structure of the light emitting device, and this will be first described.

Figure 1:
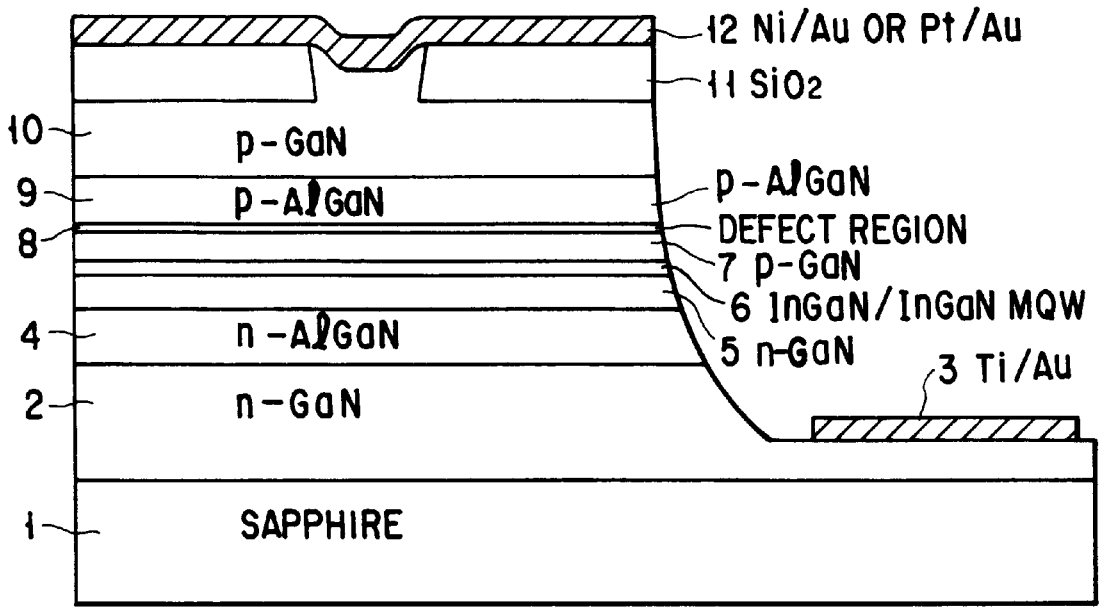
FIG. 1 is a cross sectional view of a conventional GaN-based semiconductor light emitting device.

FIG. 1 shows the main portion of the GaN-based semiconductor light emitting device, which consists of an InGaN/InGaN superlattice (MQW (multi-quantum-well) structure with a well and barrier In content ratio of 20%/3%) active layer 6, GaN guide layers 5 and 7 and cladding layers 4 and 9 made of AlGaN. The cladding layers 4 and 9 each have a large forbidden band width, and serve to carry out effective optical and carrier confinement with respect to the active region 6. The GaN-based multilayer structure includes an n-GaN contact layer 2 in a lower section, and the entire GaN-based multilayer structure is formed on a sapphire substrate 1. With the use of an insulating film 11 of $SiO_2$, a stripe-type current constriction light emitting device is formed.

In addition to the structure shown in FIG. 1, the present invention can be applied to a device employing some other type of optical and carrier confinement structure, for example, a buried stripe type. As shown in FIG. 1, in the conventional GaN-based semiconductor light emitting device, an interface region 8 having a high defect density is formed at the hetero-interface between the upper guide layer 7 and the p-AlGaN cladding layer 9 during the growth process for such a multilayer structure.

Figure 2:
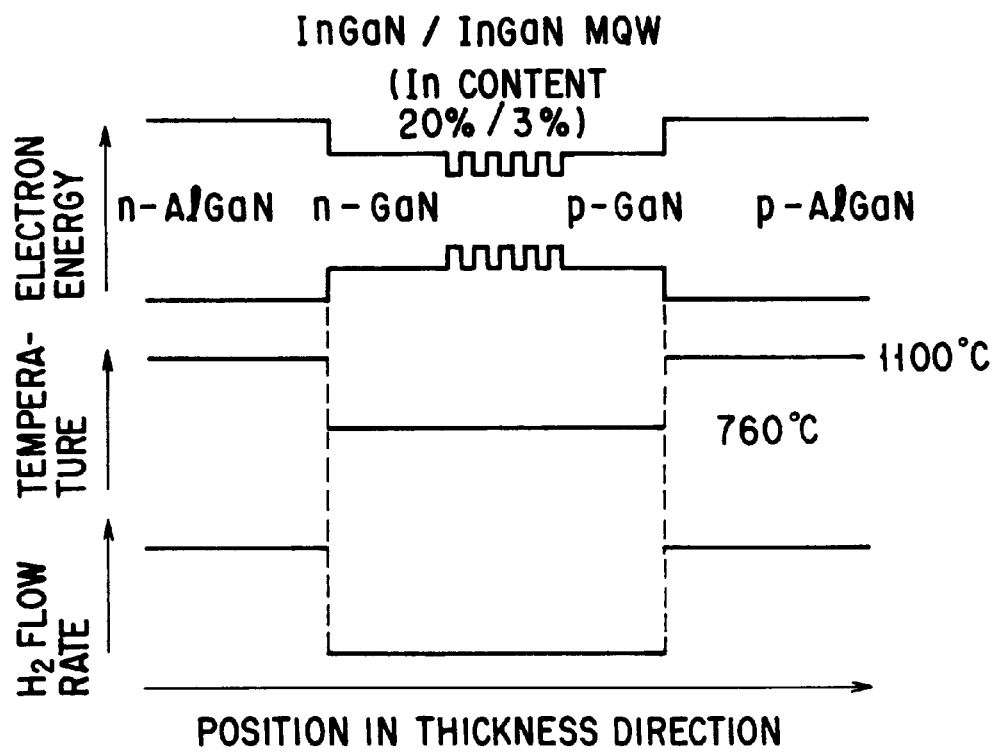
FIG. 2 is a diagram indicating the relationship between the band structure and the growth conditions of the conventional GaN-based semiconductor light emitting device.

FIG. 2 is a diagram illustrating the energy band of a GaN-based multilayer structure including cladding layers, guide layers and active layers from 4 to 9, and the growth conditions of the conventional multilayer structure grown by MOCVD (metal-organic chemical vapor deposition), are shown for the sake of future comparison. The structure of the active layer's superlattice (to be called MQW: multi-quantum well, hereinafter) consists of five undoped $In_{0.2}Ga_{0.8}N$ quantum well layers each having a thickness of 2 nm and undoped $In_{0.03}Ga_{0.97}N$ barrier layers each having a thickness of 4 nm, which interpose the wells therebetween.

As can be seen in FIG. 2, in order to form a quantum well structure having a good square wave-like energy profile, it is necessary to set the growth temperature to a relatively low temperature in the range 760° C. to 780° C., and reduce the flow rate of $H_2$ serving in the carrier gas. However, after a region of GaN having a certain thickness (which is a part of guide layer) is grown onto the MQW structure, the flow rate of $H_2$ carrier gas is increased and the growth temperature is increased to the high temperature of 1100° C., which is appropriate for the growth of AlGaN crystal.

The influence of the temperature and flow rate of $H_2$ gas on the hetero-epitaxial growth process of the AlGaN region on the GaN region, will now be described in further detail, since their influence is closely related and are thus more easily described together.

As can be understood from FIG. 2, the growth temperature and the flow rate of the $H_2$ carrier gas must be increased to the respective values appropriate for the growth of AlGaN of required quality, at the interface between the p-GaN guide layer and p-AlGaN cladding layer. Although the switching of the rate of the $H_2$ carrier gas is carried out in a short period of a time, the switching controlably of the temperature condition so widely, from 760° C. to 1100° C., requires a certain period of time, which is determined partly by the time constant of the change in the temperature of the MOCVD furnace as well as its setting time.

In the case where no switching of the growth conditions is conducted at the hetero-interface between GaN and AlGaN, the subsequently grown AlGaN is of very low crystalline quality and also the activation efficiency of the intentional p-type dopant in the said AlGaN is significantly lowered. Thus, the epitaxial growth of AlGaN on GaN at the hetero interface must be started only when the optimum growth conditions of AlGaN are satisfied.

As shown in FIG. 2, when the growth of the p-GaN guide layer is finished, the supply of the raw material gas (to be called source gas hereinafter) is stopped, and the flow rate of the $H_2$ carrier gas is increased to an optimum value for the growth of AlGaN. Then, the growth stands by until the temperature conditions for the MOCVD furnace, which are switched at the same time, reach the optimum value for the growth of AlGaN. When the conditions are met, the source gas used for the growth of AlGaN is mixed into the $H_2$ carrier gas to start the epitaxial growth of AlGaN.

As described, when the epitaxial growth is interrupted for a certain period of time at the hetero-interface, so as to obtain excellent AlGaN cladding regions, the surface of the GaN crystal which act as the substrate, is exposed to the $H_2$ carrier gas at a high temperature, supplied at a high flow rate, for the period of time of this interruption.

A GaN surface thus easily degrades not only due to the high-temperature but also the high-flow-rate of the $H_2$ gas, in contrast to an AlGaN surface. Therefore, as shown in FIG. 1, an interface region having a high defect density is created between the conventional p-GaN guide and p-AlGaN cladding layers.

The influence of the growth temperature and $H_2$ gas flow rate on the growth of the GaN-based multilayer structure is described above. Apart from this, the pressure in the epitaxial growth chamber and the flow rate of one of the source gases, ammonia ($NH_3$) are closely related to the occurrence of such an interface region 8 having a high defect density. The flow rate or the like, of the other source gases such as Ga and Al, or the flow rate of the source gas of an impurity used as the dopant, is not so directly related to the defect density, and it suffices if the flow rate ratio can be controlled in accordance with the composition ratio of compounds to be grown.

Figure 3:
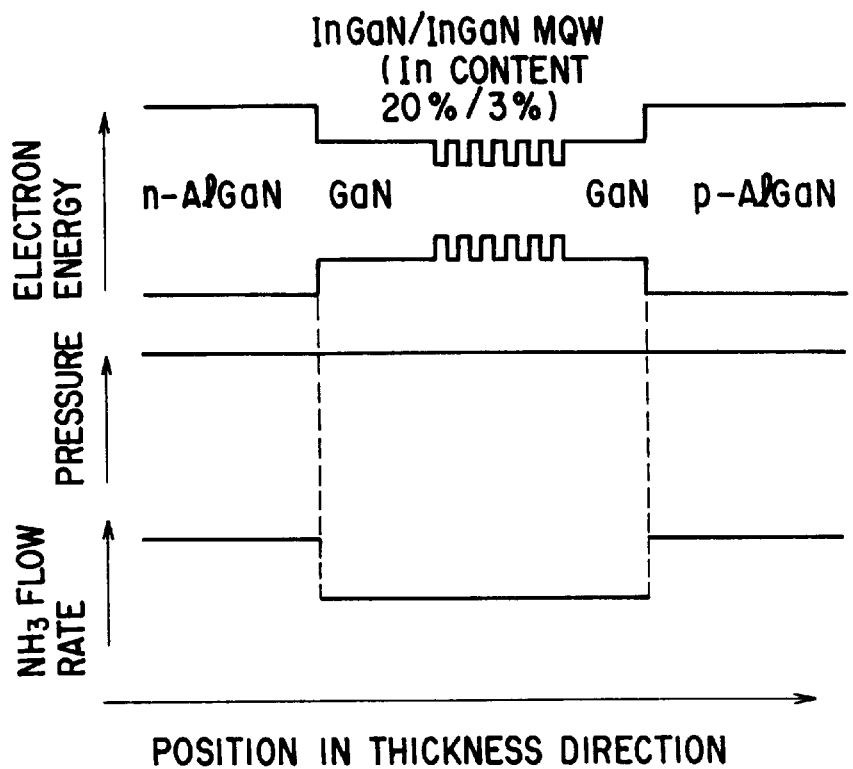
FIG. 3 is a diagram indicating the relationship between the band structure and other growth conditions of the conventional GaN-based semiconductor light emitting device.

FIG. 3 illustrates how the pressure in the growth chamber and the flow rate of $NH_3$ are usually controlled in connection with the conventional growth conditions. As shown in this figure, the flow rate of $NH_3$ is increased when growing the AlGaN cladding layers on the n-side and p-side, whereas it is decreased when growing the MQW active layer and the GaN guide layers on both sides of the active layer. Thus, the flow rate of $NH_3$ is switched significantly at the hetero-interface between the AlGaN cladding layers and GaN guide layers, causing an interface region of high defect density to be formed.

When the pressure in the growth chamber is decreased, the crystallinity of the MQW active layers and GaN guide layers is improved. However, in this case, the pressure must be switched to a higher level at the interface with the AlGaN cladding layer, and at the same time, the flow rate of $NH_3$ must be switched to the condition which meets that required for the growth of the AlGaN cladding layer. Therefore, due to the synergistic effect of these switching operations, defects are induced at a high density at the said hetero-interface.

Figure 4:
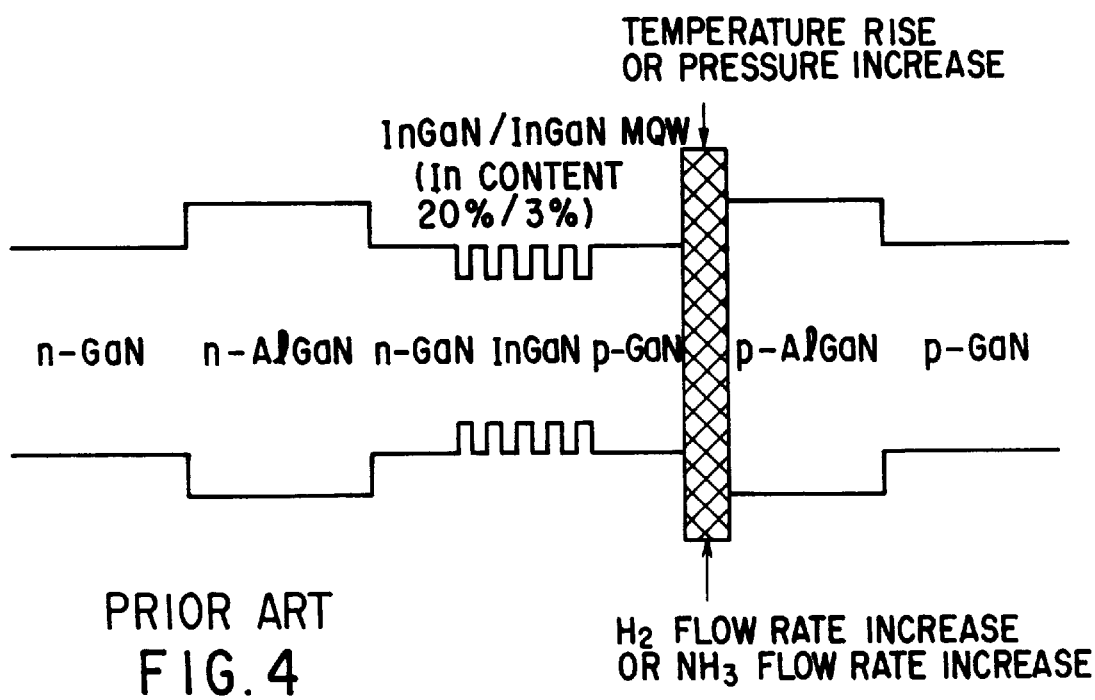
FIG. 4 is a schematic diagram of the energy band structure of the conventional GaN-based semiconductor light emitting device, designed to illustrate the drawbacks of the conventional device.

When, the growth temperature, the flow rate of $H_2$ carrier gas, the pressure in the growth chamber, or the flow rate of $NH_3$ is switched at the hetero-interface between the AlGaN cladding layer and the GaN guide layer in the conventional technique, defects are induced at a high density at the hetero-interface. The influence of this interface region, having a high defect density, on the band diagram of the GaN-based multilayer structure is illustrated in FIG. 4 as a typical model.

The width of the interface region shown as the mesh region in the figure, indicates the width of an interface region 8 having a high defect density, arising from the defects generated on the GaN surface by the interruption of the crystal growth and switching of conditions before the start of growth of the AlGaN cladding layer.

Figure 5:
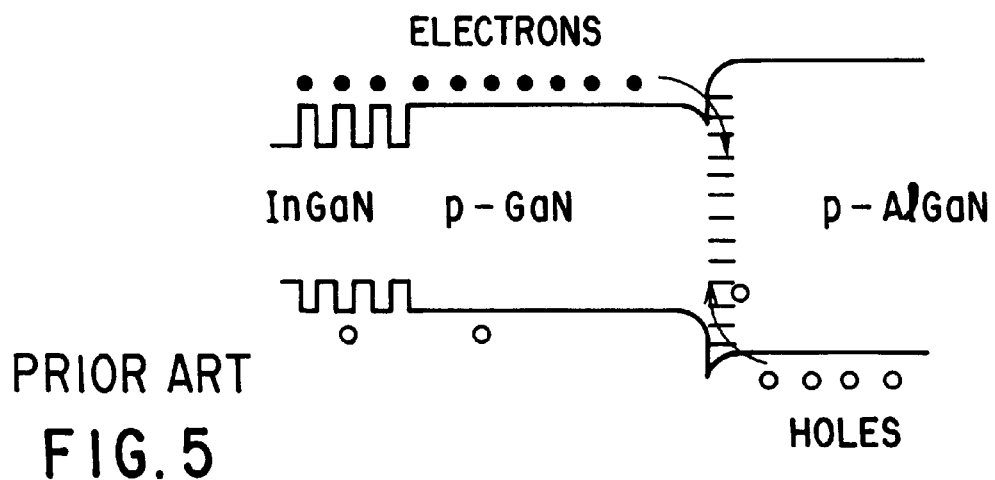
FIG. 5 is a diagram showing the energy band structure of the conventional GaN-based semiconductor light emitting device, designed to illustrate in more detail the drawbacks of the conventional device.

The height of the interface region drawn with mesh indicates the degree of the discontinuity of the band structure generated due to the influence of the high density of defects in the interface region 8. This figure illustrates the state of the band structure, in terms of both width and height, which is changed greatly under the influence of the interface region having a high defect density, generated as the temperature, or pressure, the $H_2$ flow rate or $NH_3$ flow rate is varied as indicated by arrows. FIG. 5 illustrates, more specifically, the change caused in the band structure by the inclusion of an interface region 8 having a high defect density.

The highly dense defects created between the p-GaN guide layer and p-AlGaN cladding layer form a barrier in the valence band as shown in FIG. 5 at the hetero-interface, so as to suppress the injection of holes into the active region. Further, the process of trapping positive holes in non-radiative recombination centers created in the interface, and thus annihilating them by recombination with electrons, is promoted. Thus, since the inter-band light emission of the electrons and holes in the active layer is thus influenced, the overall light emission from the active region becomes non-uniform, as it corresponds to the random density distribution of defects created at the interface region.

Figure 6:
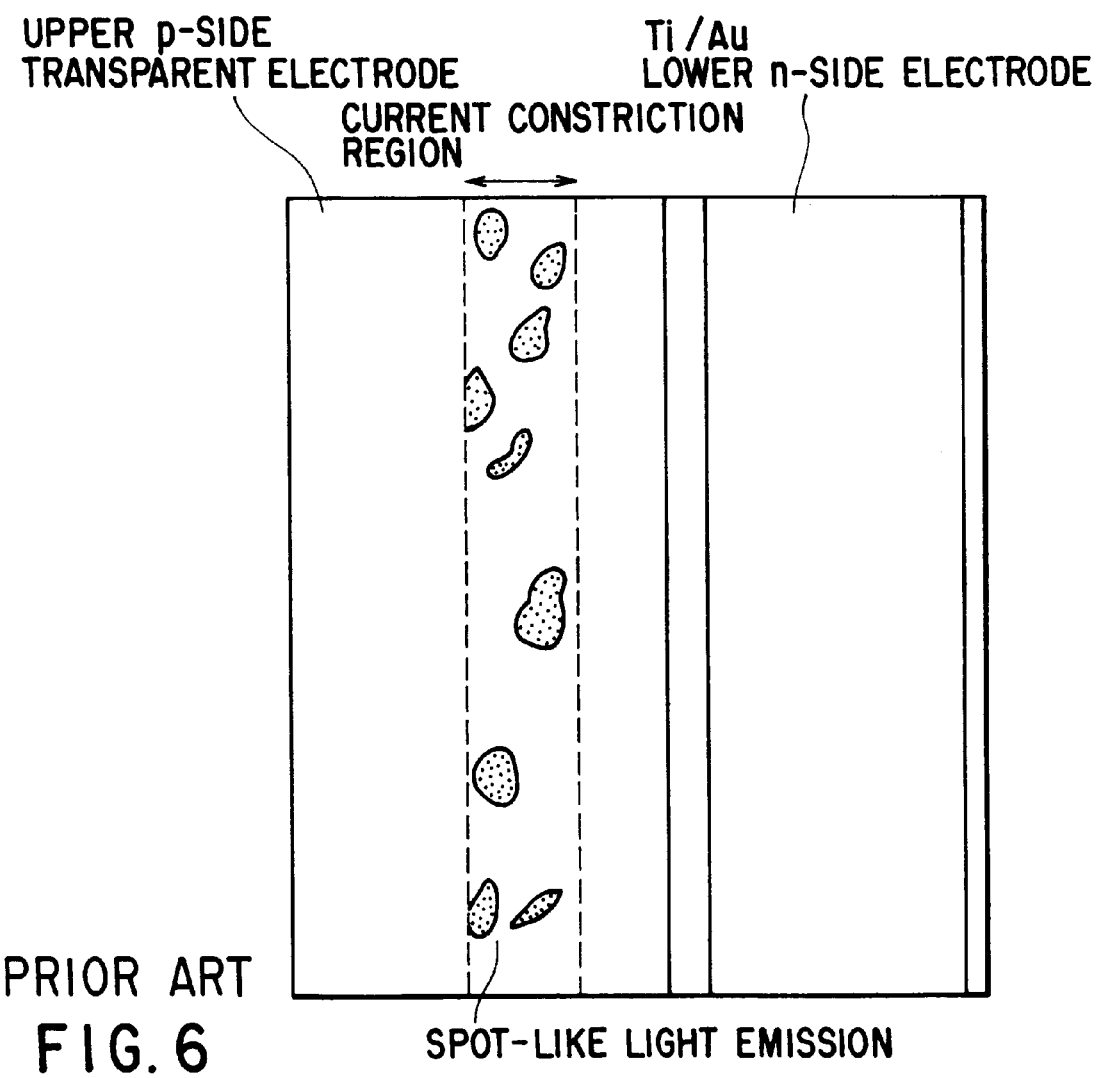
FIG. 6 is a diagram illustrating spot-like light emissions from the active layer of the conventional GaN-based semiconductor light emitting device.

FIG. 6 discloses the observation of the non-uniform light emission state. This measurement was made by forming the p-side electrode 12 of a transparent conducting material such that the emission state of the active layer could be monitored from above. As shown, a spot-like emission was observed, the pattern of which corresponds to the distribution of defect density in such a manner that a less dense portion exhibits brighter emission.

As will be described later in connection with the embodiments, the main feature of the present invention is that the growth conditions are controlled by selecting the points in the multilayer structure, where the temperature should be switched, where the type or the flow rate of the carrier gas should be switched, and where the pressure and the flow rate of $NH_3$ in the growth chamber should be switched, and more specifically, so that the creation of a high density of defects at the hetero-interface is avoided by providing a particular buffer layer at each region suffering from this problem of defects.

The types of the GaN-based material which constitutes the guide layer, cladding layer, contact layer and the like discussed in the embodiments described below, are merely some of the examples thereof. The same effects can be obtained with use of materials, $In_xAl_yGa_zB_{1-x-y-z}N$ ($0 \leq x, y, z \leq 1$, $0 \leq x+y+z \leq 1$) for the guide layer, $In_uAl_vGa_w B_{1-u-v-w}N$ ($0 \leq u, v, w \leq 1$, $0 \leq u+v+w \leq 1$) for the cladding layer, and $In_rAl_sGa_tB_{1-r-s-t}N$ ($0 \leq r, s, t \leq 1$, $0 \leq r+s+t \leq 1$) for the contact layer, by optimizing these layers adjusting the values of x, y and z; u, v and w; and r, s and t.

The following embodiments will be discussed in connection with the case whereby the guide layer is of GaN; however the same effect can be obtained also in the case where the guide layer is made of, for example, $In_xGa_{1-x}N$ ($0<x \leq 0.1$).

Figure 7:
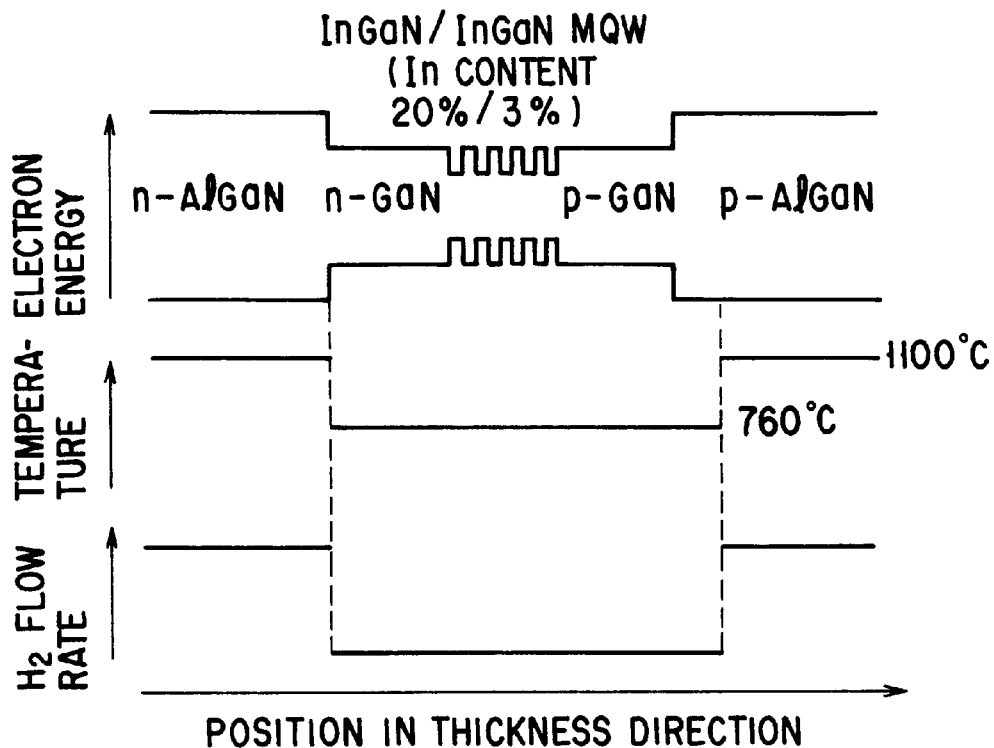
FIG. 7 is a diagram indicating the relationship between the band structure and the growth conditions of the GaN-based semiconductor light emitting device according to the first embodiment of the present invention.

The method of manufacturing a semiconductor light emitting device according to the first embodiment of the present invention, will now be described with reference to FIG. 7. In this figure, the band of the GaN-based multilayer structure including the InGaN/InGaN(In content 20%/3%)MQW active layer, the GaN guide layer and the AlGaN cladding layer, and the growth conditions of the multilayer structure grown by the MOCVD method are illustrated in comparison to the standard case described above.

The first embodiment is characterized by the switching of the temperature and $H_2$ gas flow rate during the growth of the p-AlGaN cladding layer. Since the hetero-interface between p-GaN and p-AlGaN is formed at a temperature (760° C.) and an $H_2$ gas flow rate, both lower than those of the optimal growth conditions for p-AlGaN, the activation of Mg ions, serving as a p-type impurity, is reduced, and accordingly the hole concentration in AlGaN becomes lower than the designed value.

However, as mentioned before, the flow rate of $H_2$ carrier gas is low, and the temperature condition does not vary at the hetero-interface, the source gas for the growth of AlGaN can be introduced into the $H_2$ carrier gas almost instantaniously without interrupting the epitaxial growth process. Consequently, the defect density at the hetero-interface decreases a significant amount.

Further, in the first embodiment, the flow rate of the $H_2$ carrier gas and the temperature are increased during the growth of the AlGaN region, and therefore it suffices merely if the flow rate is increased while maintaining a constant ratio of the source gas in the $H_2$ carrier gas necessary for the growth of AlGaN. Therefore, while increasing the growth temperature from 760° C. to 1100° C., the growth of the AlGaN region can be continuously carried out without interrupting the epitaxial growth.

In this case, the AlGaN grown at 760° C., before the increase in temperature, has a low activation rate of Mg ions, and therefore the hole concentration in the p-AlGaN adjacent to the hetero-interface is reduced lower than the designed value. However, the growth of the p-AlGaN cladding layer, which follows, is carried out at high temperature and at a high $H_2$ gas flow rate, and as a result, the activation of the as yet unactified Mg ions in the low temperature AlGaN portion can be achieved due to a heating effect, thus recovering the hole concentration of the AlGaN cladding layer to a value comparable to the designed value. The effect of the lower crystal quality of the low temperature AlGaN region can be overcome by keeping its thickness very small.

As described, conventionally, the growth conditions are switched at the hetero-interface, whereas in the first embodiment, the growth conditions are switched during the formation of the cladding layer. Therefore, it is not necessary to make a pause in the crystal growth at the hetero-interface, and thus highly dense defect concentrations are not created during the switching of the conditions.

Figure 8:
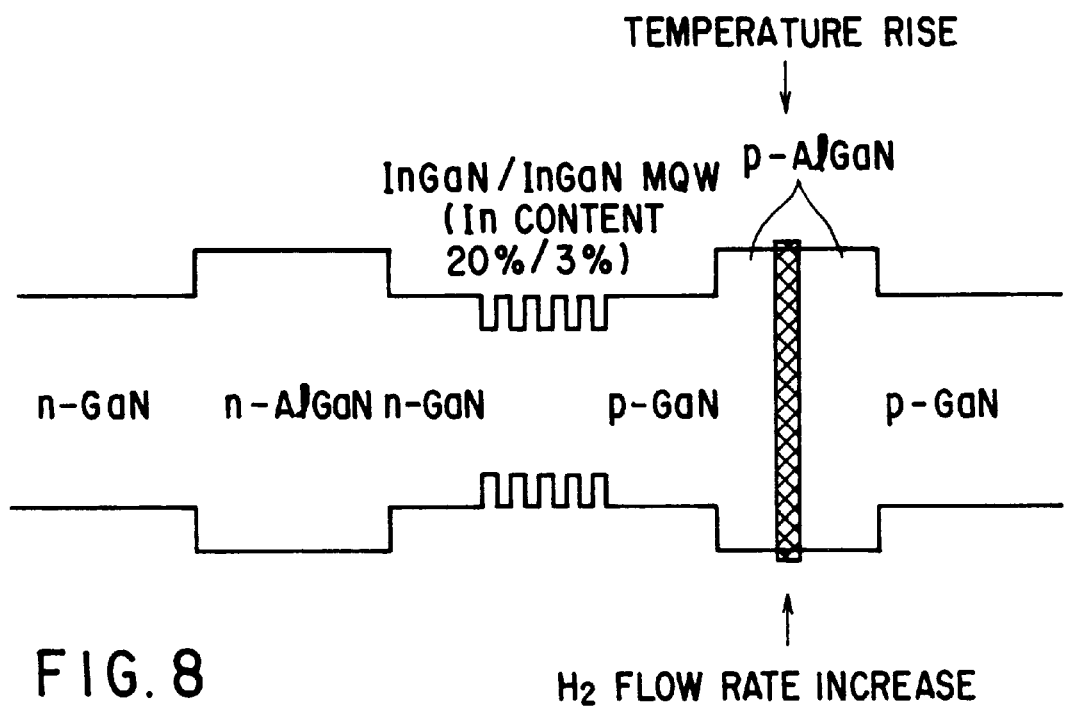
FIG. 8 is a schematic diagram of the energy band structure of the device according to the first embodiment of the present invention.

FIG. 8 is a schematic diagram illustrating the influence on the band structure in the case where the temperature and $H_2$ carrier gas flow rate are switched during the growth of the p-AlGaN cladding layer. As can be seen from this figure, the effect of the interface region having a high defect density, created while switching the growth temperature and hydrogen flow rate, is much reduced as compared to the conventionally grown GaN-based light emitting device.

Figure 9:
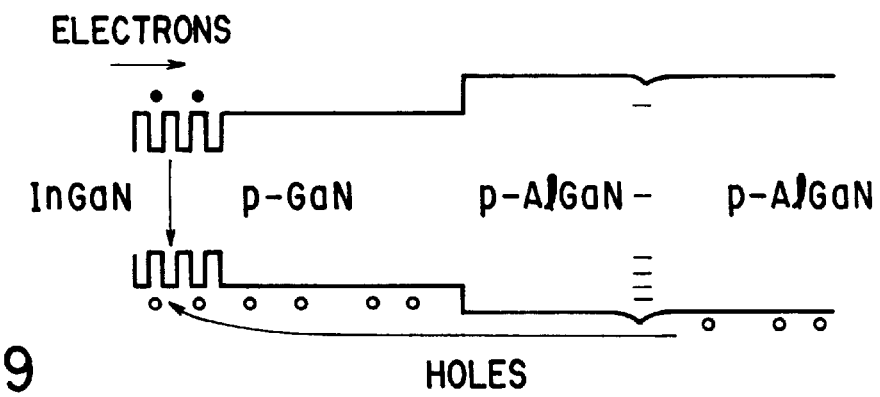
FIG. 9 is a diagram showing a more detailed energy band structure of the device according to the first embodiment of the present invention.

FIG. 9 shows more specifically the change in the band structure. As shown, the defect density is decreased significantly and defects are present in the p-AlGaN region having a relatively high p-type concentration, thus the bending of the energy band and the subsequent blocking of holes is very much suppressed. Consequently, the injection of holes into the active layer is much more uniform over the active region, and the non-uniform light emission due to the previously found non-uniform defect distribution, can be greatly suppressed.

The decrease in the defect density and the suppression of the blocking of the hole current, which are achieved by switching the growth conditions in the relatively high concentration p-type AlGaN cladding layer, is also due to the effect of using Mg (as the p-type) dopant as the presence of Mg ions causes the crystal lattice to become more flexible and thus less likely to form defects due to any strain between the GaN and AlGaN regions.

An Mg ion has an ionic radius larger than that of Ga or N ion. Consequently, when Mg ion is added as an impurity into the GaN-based crystal, a slight lattice strain occurs in the periphery of the Mg ion. This fact seems to contradict with the object of decreasing the density of defects created in the interface between GaN and AlGaN.

However, the strain of Mg ion on the crystal has an effect of suppressing the dislocation motion and the proliferation of defects, which follows, and thus, the region affected by the defects is decreased by the addition of the Mg ions.

Figure 10:
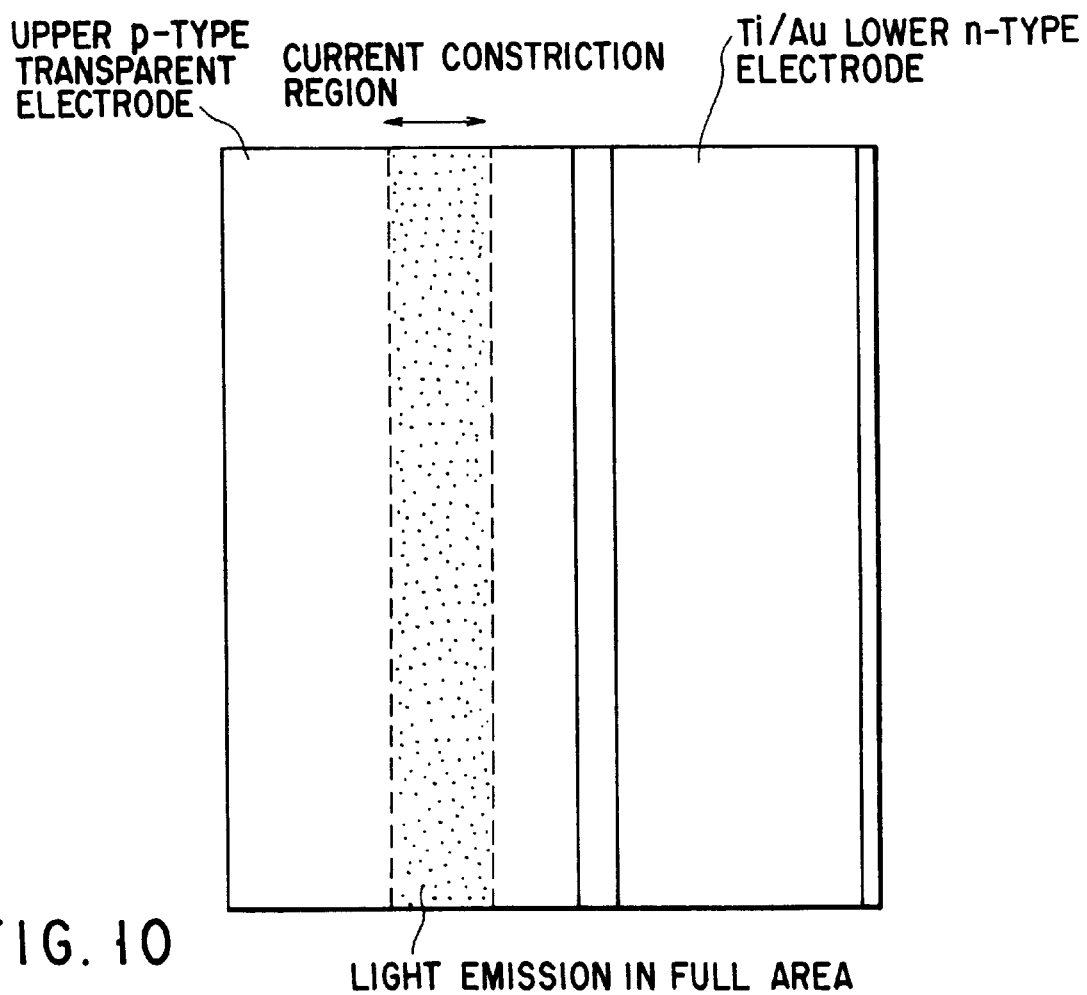
FIG. 10 is a diagram illustrating the uniform light emission from the active layer of the device according to the first embodiment of the present invention.

FIG. 10 shows how the light emission in the active layer is uniform along the stripe for the current constriction, due to the decrease in defect density. As can be understood from this figure, the uniformity of the light emission is very much improved as compared to the case shown in FIG. 6.

As described, the conventional GaN-based semiconductor light emitting device entails an interface region having a high defect density at the hetero-interface between the guide layer and the cladding layer, due to the interruption of the epitaxial growth at this point. By contrast, employing the manufacturing method according to the first embodiment, the density of defects created at the hetero-interface can be suppressed to substantially zero.

It should be noted that the density of defects is defined as follows. That is, in the case where the defect density is distributed along the interface of two layers, the number of defects per unit area of the layer is obtained within the range of the thickness of the layer, that is, x, to x+Δx, and the obtained number is divided by Δx. When Δx tends to zero, the rate of change of the defect density concentration with thickness of the layer can be accurately given.

The switching of the temperature and the $H_2$ gas flow rate does not always have to be carried out during the growth of the p-AlGaN layer, but it can be carried out during the growth of the p-GaN guide layer. In this case, at the hetero-interface between the p-GaN guide layer and p-AlGaN cladding layer, the temperature condition and $H_2$ gas flow are already stable, and therefore the growth can be made continuously. Consequently, there is no interruption of the epitaxial growth at the hetero-interface, and the generation of defects at this interface is very much reduced. Further, for the same reason described before, the generation of defects are also much reduced in the switching position in the p-GaN guide layer.

Next, the second embodiment will now be described with reference to FIG. 11. In the second embodiment, the position where the temperature is increased and the position where the $H_2$ gas flow rate is increased, are shifted from each other, so as to avoid the generation of a large density of defects, which is caused if both positions coincide with each other as in the conventional technique.

Figure 11:
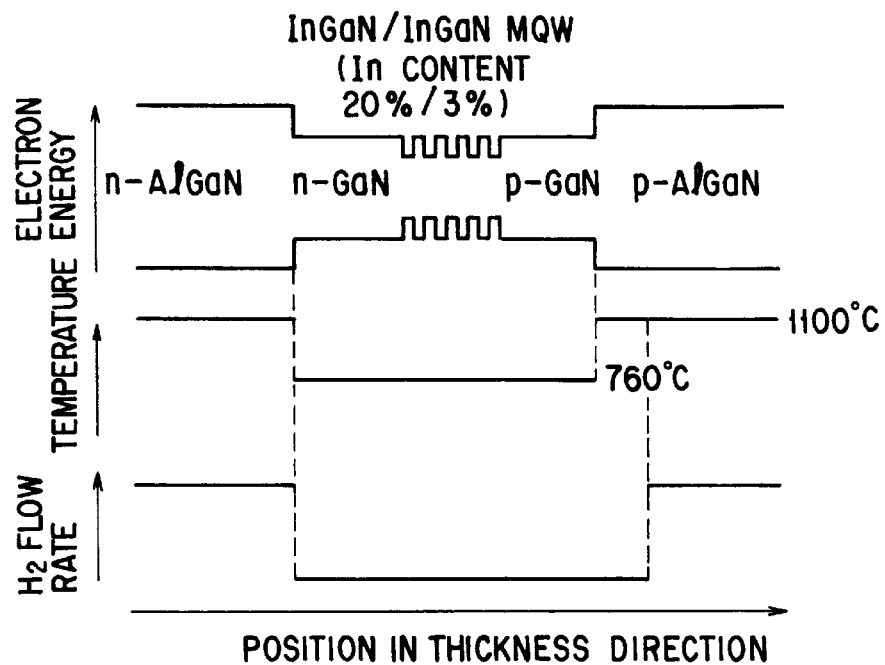
FIG. 11 is a diagram indicating the relationship between the band structure and the growth conditions of the GaN-based semiconductor light emitting device according to the second embodiment of the present invention.

As can be seen in FIG. 11, the temperature is increased at the hetero-interface between the p-GaN guide layer and p-AlGaN cladding layer, and the $H_2$ gas flow rate is increased within the p-AlGaN cladding layer. With this structure, the flow rate of the $H_2$ carrier gas is low at the said hetero-interface, and therefore the degradation of the GaN crystal surface due to the complex surface reaction between $H_2$ and the GaN surface, is lessened, thus reducing the generation of defects at the interface. However, this method does entail a drawback, in that some defects are produced at the hetero-interface. However, the density of such defect is very much reduced in comparison to the standard case.

In contrast to the above technique, it is also possible to increase the $H_2$ flow rate at the hetero-interface between the p-GaN guide layer and p-AlGaN cladding layer, and increase the temperature within the p-AlGaN cladding layer. In this method, the generation of defects at high density, which occurs synergistically when the increments of these conditions coincide with each other, can be suppressed.

Further, the p-AlGaN cladding layer can be grown completely employing a low $H_2$ gas flow. With this method, the degradation of the surfaces, which is caused by the complicated interaction between $H_2$ and the p-GaN surface or p-AlGaN surface, can be lessened, thus suppressing the generation of defects at the interfaces.

Next, the third embodiment of the present invention will now be described with reference to FIG. 12.

Figure 12:
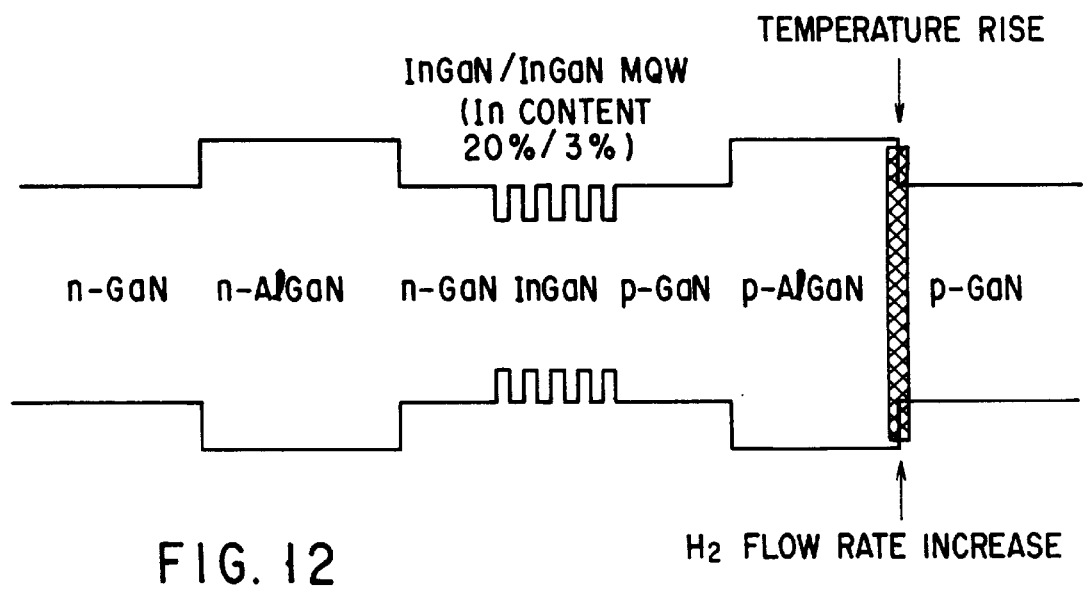
FIG. 12 is a schematic diagram of the energy band structure of the device according to the third embodiment of the present invention, designed to illustrate the effect of the embodiment.

As can be seen in FIG. 12, in the third embodiment, both of the points where the growth temperature and the $H_2$ gas flow rate is increased, are situated after the growth of the p-AlGaN cladding layer. With this structure, the influence of defects in the vicinity of the hetero-interface between the p-AlGaN cladding layer and p-GaN contact layer, can be severly reduced as compared to the case where the growth temperature and $H_2$ gas flow rate are increased at the hetero-interface between the p-GaN guide layer and p-AlGaN cladding layer.

This is because AlGaN is more stable than GaN at high temperature, and therefore the generation of surface defects due to an increase in temperature and $H_2$ flow is less. Further, since the p-AlGaN cladding layer is grown in a dilute $H_2$ gas state at all times, the degradation of the surface, which is caused by the complicated interaction occurring between the p-AlGaN surface and $H_2$ while the temperature is being increased, is lessened. Furthermore, doping impurities are added to both of the cladding layer and contact layer in high concentrations to reduce any barrier to hole conduction. The disadvantage to this method is the poor crystalline quality of the thus grown AlGaN, although interface problems are removed. Therefore, when using this method the cladding region thickness is usually kept thin.

In the third embodiment, the activation of Mg impurity added to the AlGaN cladding layer is carried out at the same time as the Mg impurity is activated in the GaN contact layer grown at high temperature as was described above.

As described above, all of the first to third embodiments are described in connection with the p-type side of the GaN-based multilayer structure, as to specify the appropriate points where the temperature and $H_2$ gas flow rate should be switched; however, the present invention is not only limited to the p-type side. For example, in FIG. 1, when growing the n-GaN guide layer 5 on the n-AlGaN cladding layer 4, the temperature and $H_2$ gas flow rate are both decreased in the hetero-interface between these layers. As these conditions are changed, the epitaxial growth is also interrupted, thus generating a defect region at the hetero-interface.

As discussed in the third embodiment, an AlGaN surface is more stable than a GaN one in high $H_2$ gas flow rate atmosphere at high temperature, and therefore the density of defects made at the interface is lower than that of the corresponding hetero-interface on the p-side. Further, in the GaN-based crystal, the drawback of the reduction of the activation rate of dopant is not very much influential in the n-side as in the p-side.

However, once the present invention is applied on the p-side, defects created at the hetero-interface on the n-side, and the threading of these defects through the active region have an adverse effect on the operation voltage, threshold current and emission uniformity of the semiconductor device. Therefore, when the points where the temperature and $H_2$ gas flow rate are switched from high to low values, are selected in the n-side in a corresponding fashion to those in the p-side, an even larger improvement in device characteristics can be obtained.

As described, the major feature of the present invention resides in the fact that the points where growth conditions are switched are shifted from the position of a hetero-interface where the composition of the crystal makes a transition. In an usual case, as the composition of crystal makes a transition, a very slight change in temperature occurs. However, such a very slight temperature change is not a subject of the present invention.

Further, the first to third embodiments are described in connection with the case where the entire GaN-based multilayer structure is grown in such a manner that the n-side is grown first; however the method of the present invention can be applied also to the case where the p-side of the structure is grown first. In this case, the temperature and $H_2$ flow gas are switched from high to low on the p-side, whereas these conditions are switched from low to high on the n-side.

When the positions where these conditions should be switched, in this case, are selected as described in the first to third embodiments, an excellent result can be obtained.

Next, the fourth embodiment of the present invention will now be described with reference to FIGS. 13 and 14.

Figure 13:
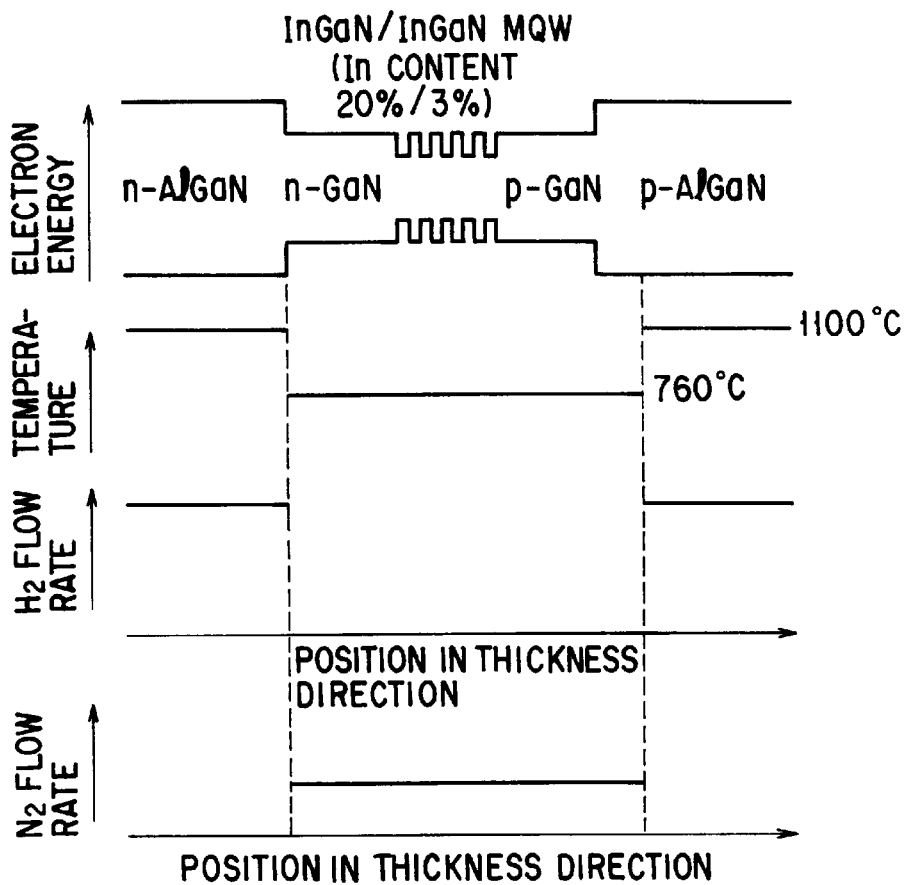
FIG. 13 is a diagram indicating the relationship between the band structure and growth conditions of the GaN-based semiconductor light emitting device according to the fourth embodiment of the present invention.

As can be seen in FIG. 13, the fourth embodiment is similar to the first embodiment in terms of that a rise in growth temperature and an increase in the flow rate of carrier gas are carried out during the growth of an AlGaN cladding layer; however it is characterized in that the type of carrier gas is switched at the same time as illustrated in the lower section of FIG. 13.

More specifically, using $N_2$ as a carrier gas at a low flow rate, an MQW active layer and a GaN guide layer are grown at a temperature of 760° C., and then the source gas is switched while maintaining the temperature and the $N_2$ flow rate, and an AlGaN cladding layer is grown. Next, the carrier gas is switched to $H_2$ and at the same time, the flow rate thereof is increased. Further, while increasing the temperature to 1100° C., an AlGaN cladding layer is grown without interruption.

As described, the formation of the MQW active layer and the GaN guide layer is carried out in high-purity $N_2$ supplied at low rate, and therefore the deterioration of the quality of the active and GaN guide layer, which occurs when the flow rate of $H_2$ is high, can be avoided.

Similar results as described above are obtained by using carrier gases of two mixtures of $H_2$ and $N_2$ as the first and second carrier gases wherein the first has a low $H_2$ content and the second a high one, and by switching the carrier gas during growth from the first carrier gas at a first flow rate to the second carrier gas at a second flow rate.

Figure 14:
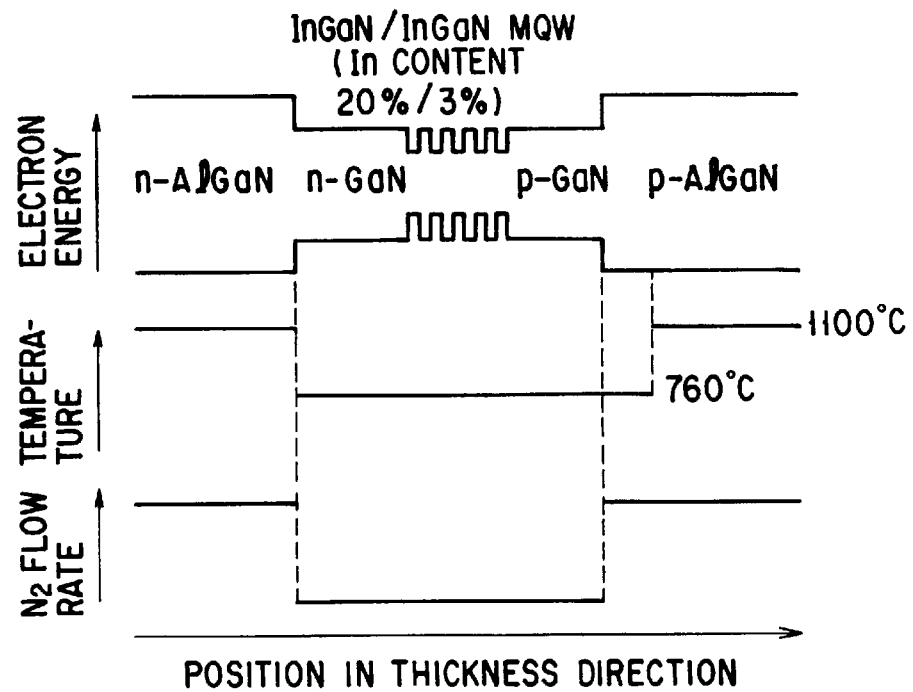
FIG. 14 is a diagram indicating the relationship between the band structure and other growth conditions of the GaN-based semiconductor light emitting device according to the fourth embodiment of the present invention.

Alternatively, as shown in FIG. 14, in place of using $H_2$ as a carrier gas, $N_2$ may be used all the way through the process. In this case, since the AlGaN cladding layer, which has a high reactivity with respect to oxygen, is grown at high temperature in a non-reducing $N_2$ gas, the $N_2$ gas must be of a high-purity type.

As can be understood from FIG. 14, if the growth temperature is increased within the AlGaN cladding layer, the defect density at the hetero-interface is decreased, thereby achieving an excellent result.

In the fourth embodiment, the growth temperature or the carrier gas flow rate is switched within the cladding layer; however it needs not always be switched in the cladding layer, but it may also be switched in the GaN guide layer with a similar excellent result.

Next, the fifth embodiment of the present invention will now be described with reference to FIG. 15. In each of the first to fourth embodiments, the influence of the growth temperature and the $H_2$ gas flow rate, on the growth of the GaN-based multilayer structure, was described. The pressure in the epitaxial chamber and the flow rate of $NH_3$, which is one of the source gases supplied to the chamber, are also closely related to the occurrence of defects at the interface region.

As described above, when the pressure and $NH_3$ flow rate are switched at the hetero-interface between the AlGaN cladding layer and GaN guide layer, defects are induced at high density at the hetero-interface. When the pressure is decreased, the crystallinity of the MQW active layer and GaN guide layer is improved, whereas when the pressure is increased at the border to the AlGaN cladding layer and, at the same time, the $NH_3$ flow rate is switched to an appropriate condition for the growth of the AlGaN cladding layer, defects are induced at high density at the hetero-interface due to the synergistic effect of both.

However, it should be noted that when the pressure is reduced, the gas flow is increased and the gases present in the chamber are well mixed, thereby stabilizing the growth conditions and making it possible to obtain a hetero-interface having a low defect density at even a lower $NH_3$ flow rate.

Figure 15:
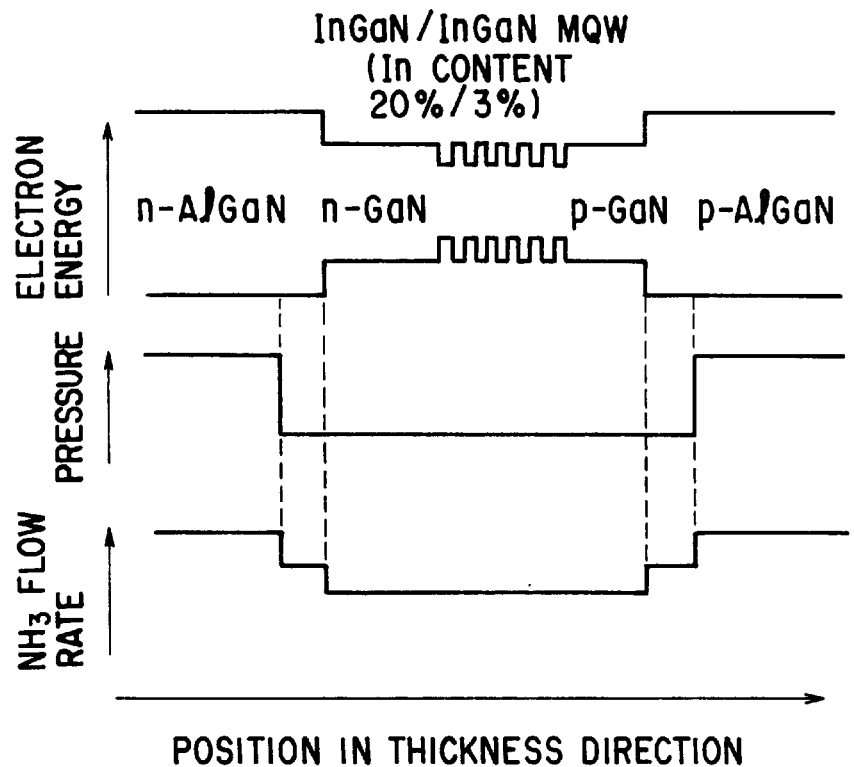
FIG. 15 is a diagram indicating the relationship between the band structure and growth conditions of the GaN-based semiconductor light emitting device according to the fifth embodiment of the present invention.

FIG. 15 shows a method of obtaining an excellent hetero-interface, by utilizing the above-described phenomenon. In this method, the pressure is increased during the growth of the AlGaN cladding layer, which follows after the completion of the growth of the hetero-interface between the GaN guide layer and AlGaN cladding layer. Thus, the MQW active layer and GaN guide layer are grown in low pressure conditions, thereby assuring an excellent crystallinity.

The defect density at the hetero-interface and the switching method of the flow rate of $NH_3$, which is connected to the defect density, will now be described in further detail. As in the case of $H_2$ carrier gas, $NH_3$ has a similar effect of degrading the surface of GaN at high temperature. Due to this effect, defects are induced at high density at the hetero-interface between the GaN guide layer and AlGaN cladding layer. Therefore, it is desirable that the flow rate of $NH_3$ should be low while forming the hetero-interface.

However, unlike $H_2$, $NH_3$ is a raw material for the epitaxial growth, and the flow rate of $NH_3$ must be controlled to make the incorporated N content appropriate in accordance with the type of GaN-based film to be grown. Thus, it is conventionally considered to be difficult to decrease the flow rate of $NH_3$ to a level at which a degradation-free excellent surface can be obtained.

As described above, when the pressure in the growth chamber is decreased, the gas flow is raised and $NH_3$ is well mixed within the chamber. Therefore, even if the flow rate of $NH_3$ is lower than that in the usual growth condition, the composition of the epitaxial growth layer is maintained as normal.

For the reason stated above, it becomes possible to reduce the flow rate of $NH_3$, which in turn reduces the degradation of the hetero-interface, by decreasing the pressure in the growth chamber. Therefore, when the heterojunction region between the GaN guide layer and AlGaN cladding layer is grown at a reduced pressure condition, a hetero-interface having a lower defect density can be obtained.

That is, as can be seen in FIG. 15, when the hetero-interface between a GaN guide layer and AlGaN cladding layer is grown in a low pressure condition, a portion of the AlGaN cladding layer adjacent to the hetero-interface is grown at a lower pressure than usual.

Thus, the flow rate of $NH_3$ necessary to grow the aforementioned portion of the AlGaN cladding layer is lower than the normal value shown at both ends of FIG. 15, but higher than the flow rate of $NH_3$ necessary to grow the GaN guide layer and MQW active layer, that is, at an intermediate value between the two.

In this embodiment, a hetero-interface having a low defect density can be obtained by forming it in a low pressure condition appropriate for obtaining an excellent crystallinity and at a low flow rate of $NH_3$, which reduces the degradation of the GaN surface.

As can be understood from FIG. 15, the same method can be applied not only to the p-side but also to the n-side. Further, with this method, it is possible to avoid the non-uniformity of light emission, which is caused by the non-uniform distribution of defects created at the hetero-interface, as described in connection with FIG. 6.

Figure 16:
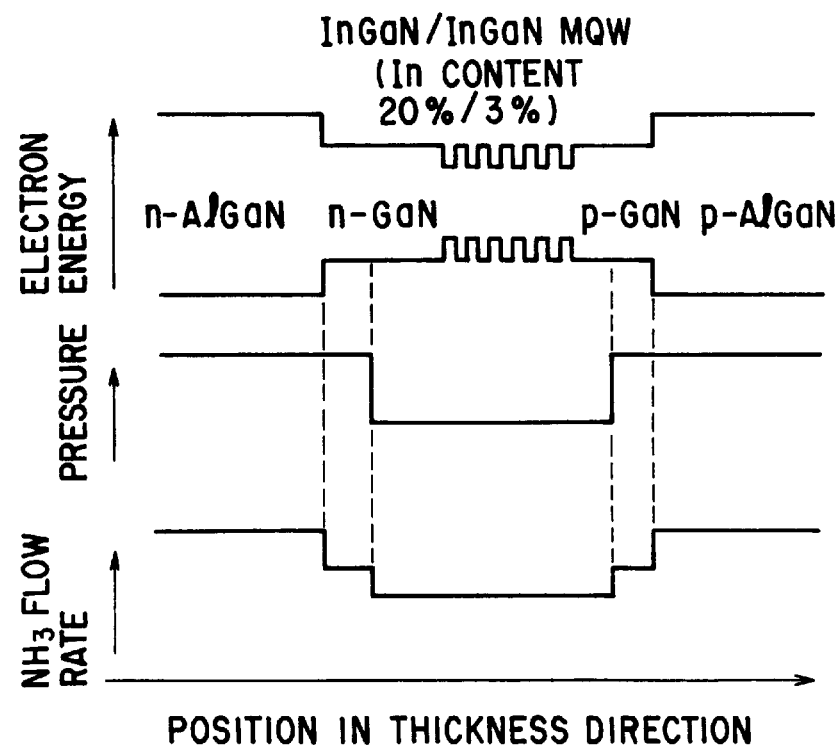
FIG. 16 is a diagram indicating the relationship between the band structure and other growth conditions of the GaN-based semiconductor light emitting device according to the fifth embodiment of the present invention.

In the above description, the pressure and the flow rate of $NH_3$, are switched in the AlGaN cladding layer; however they need not always be switched in the cladding layer, but they may be switched in the GaN guide layer. FIG. 16 illustrates the method of switching the pressure and $NH_3$ flow rate within the GaN guide layer.

If the pressure is switched from low to high in the GaN guide layer, the flow rate of $NH_3$ necessary to grow the GaN guide layer must be increased as shown in FIG. 16. Further, in order to grow the AlGaN cladding layer adjacent to the GaN guide layer, the flow rate of $NH_3$ must be further increased.

It can be understood that with use of this method, the increase in the flow rate of $NH_3$ at the hetero-interface is less than that in the conventional technique in which the pressure and flow rate of $NH_3$ are switched at the hetero-interface at the same time. The same method can be applied not only to the p-side, but also to the n-side.

It should be noted that it is also possible that the temperature, pressure and flow rate of $H_2$, $N_2$ and $NH_3$ are switched at the hetero-interface between the AlGaN cladding layer and GaN contact layer in the fourth and fifth embodiments. This is because doping impurities that are added to the cladding layer and contact layer in high concentrations, and current blocking by the formed interface defects are much reduced, as explained in connection with FIG. 12.

The sixth embodiment of the present invention will now be described with reference to FIG. 17. The above-described interface region containing defects at high density can be applied for the formation of a current constriction structure necessary for achieving a high-efficiency LD light emission.

Figure 17:
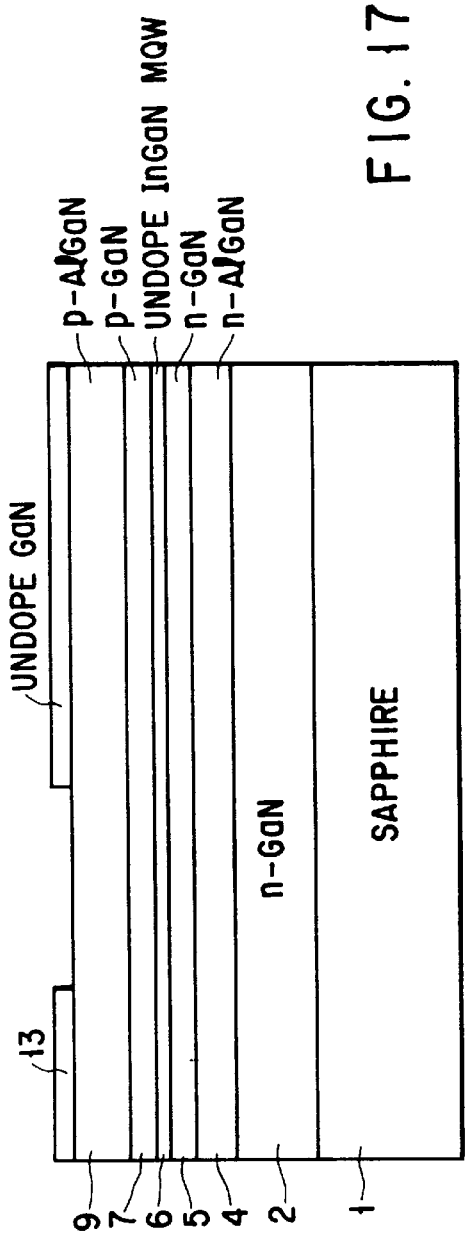
FIG. 17 is a cross sectional view illustrating an intermediate stage of the method of forming a current confinement structure of the GaN-based semiconductor light emitting device according to the sixth embodiment of the present invention.
Figure 18:
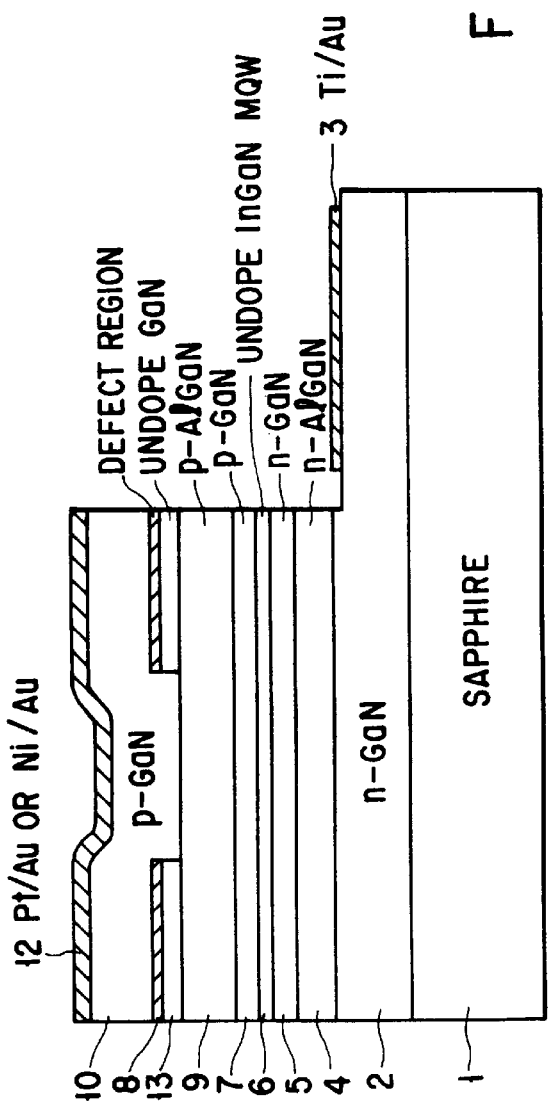
FIG. 18 is a cross sectional view illustrating the method of forming a current confinement structure of the GaN-based semiconductor light emitting device according to the sixth embodiment of the present invention.

As can be seen in FIG. 17, an undoped GaN region 13 is subjected to selective etching to form a stripe structure, and as shown in FIG. 18, and a p-GaN contact layer 10 is grown on top. Thus, the underlying layer of epitaxial grown p-AlGaN cladding layer 9 is exposed under the stripe, and the undoped GaN region 13 used for the formation of the said stripe. The growth temperature and the $H_2$ gas flow rate are increased at the same time, during the start of the growth of the p-GaN contact layer 10.

As described above, the AlGaN cladding layer 9 has a stable surface under conditions of high temperature and high $H_2$ gas flow rate, and therefore the generation of defects at the hetero-interface between the cladding layer and the p-GaN contact layer 10 grown thereon, is suppressed. However, the undoped GaN region 13 will have a degraded surface under such conditions of high temperature and high $H_2$ gas flow rate, and high defect density are generated at the interface between the p-GaN contact layer 10 and itself. Consequently, as described in connection with FIG. 5, a barrier to the hole current flow is formed at the interface, and therefore the flow of current of holes through this region can be blocked.

Since the undoped GaN layer 13 has a high resistance, it may be considered not necessary to block the hole current by generating such a barrier with defects at the interface.

However, the GaN layer usually contains a great number of dislocations which propagate from the substrate along the growth direction, to form a current leakage path, and therefore its efficiency as a current blocking region is reduced. Under these circumstances, a barrier is formed at the interface, with the defect region 8, to seal the leakage path running in the growth direction of the undoped GaN layer 13. Thus, the hole current blocking effect of the undoped GaN layer 13 is improved.

As described above, with the use of an undoped GaN layer 13, a stripe type current constriction structure in conjunction with the p-GaN contact layer 10 is formed. Such a constriction structure can make the in-process induced stress very small in comparison to the conventional current constriction structure formed by using an insulating film such as $SiO_2$. Consequently, it is possible to form the current constriction structure much closer to the active layer 6, and thus achieve a higher light emission efficiency.

The sixth embodiment was described in connection with the technique of utilizing the interface region containing high defect densities for the formation of a stripe type current constriction structure; however such an application is not limited to the case of the sixth embodiment. When such a technique is modified, various current constriction structures which are not conventionally known, can be formed.

Next, the seventh embodiment of the present invention will now be described with reference to FIGS. 19 and 20. FIG. 19 is a schematic diagram showing a cross section of a GaN-based LD structure of the seventh embodiment.

The GaN-based LD consists of a sapphire substrate 1, a GaN buffer layer 2a, an n-GaN contact layer 2 (Si-doped, $5 \times 10^{18}$ cm$^{-3}$, thickness of 4 $\mu$m), an n-$Al_{0.15}Ga_{0.85}$N cladding layer 4 (Si-doped, $1 \times 10^{18}$ cm$^{-3}$, thickness of 0.3 $\mu$m), an n-GaN guide layer 5 (Si-doped, thickness of 0.1 $\mu$m), an MQW active layer 6 consisting of five layers of $In_{0.2}Ga_{0.8}$N quantum well (undoped, 2 nm) and $In_{0.05}Ga_{0.95}$N barrier layers (undoped, 2 nm) which interpose these five layers therebetween, a p-GaN guide layer 7 (Mg-doped, thickness of 0.1 $\mu$m), a p-$In_{0.05}Al_{0.2}Ga_{0.75}$N buffer layer 8a (Mg-doped, $1 \times 10^{18}$ cm$^{-3}$, thickness of 0.1 $\mu$m), a p-$Al_{0.15}Ga_{0.85}$N cladding layer 9 (Mg-doped, $1 \times 10^{18}$ cm$^{-3}$, thickness of 0.3 $\mu$m), a p-GaN contact layer 10 (Mg-doped, $1 \times 10^{18}$ cm$^{-3}$, thickness of 1 $\mu$m), an insulating film made of $SiO_2$ 11, a p-side electrode 12a having a structure of Pt(5 nm)/Ti(50 nm)/Pt(30 nm)/Au(100 nm), a p-side pad electrode 12 having a structure of Ti/Au and an n-side electrode 3 having a structure of Ti/Au.

FIG. 19 shows the multilayer structure of a GaN-based LD, which is grown continuously in one process by the MOCVD method. In this embodiment, the GaN buffer layer 2a on the sapphire substrate 1 is grown at 550° C., those from the n-GaN contact layer 2 to the n-GaN waveguide layer 5 at 1100° C., those from the MQW active layer to the p-$In_{0.05}Al_{0.2}Ga_{0.75}$N buffer layer 8a, at 800° C. Further, the temperature is increased while maintaining the supply of the source gas for the formation of the p-$In_{0.05}Al_{0.2}Ga_{0.75}$N buffer layer 8a so as to continuously grow the layers, and thus the p-$Al_{0.15}Ga_{0.85}$N cladding layer 9 and the p-GaN contact layer 10 are formed at 1100° C.

Then, the entire structure thus obtained is coated with an $SiO_2$ insulating film 11, and a stripe is made within the upper electrode formation region of the film. This stripe, having a width of 10 $\mu$m, is made is such a manner as to expose the surface of the p-GaN contact layer 10, onto which layers are evaporated consecutively to form a p-side electrode 12a having a Pt/Ti/Pt/Au structure, and the subsequent electrode is subjected to a heat treatment at 350° C. in an $N_2$ atmosphere. Thus, Pt is diffused into the contact layer to an appropriate degree, so as to reduce the contact resistance of the p-side electrode, and at the same time, nitrogen, which is diffused upwards from the p-GaN contact layer 10, and Ti undergo a solid phase reaction to form a stable compound. Therefore, the degradation of the contact characteristics during operation can be prevented.

Next, a p-side Ti/Au pad electrode 12 is formed on both the p-side electrode 12a and SiO$_2$ insulating film. Further, a mesa containing the p-side electrode is formed and thus the n-side electrode can be applied, and an n-side Ti/Au electrode 3 is formed on the n-GaN contact layer 2 which is situated in the trough at the side of the mesa. In the process described above, the p-side electrode 12a is formed before the formation of the n-side electrode 3; however it is also possible that the p-side electrode 12a is formed after the formation and heat treatment of the n-side electrode 3.

Subsequently, the back of the sapphire substrate 1 is mirror-polished until the thickness thereof becomes 50 μm, after which the wafer is cleaved in the contrary direction to the p-side electrode (that is, (11(bar)00) face or (112(bar)0) of GaN), thus forming an LD chip having a length of 1 mm. A high reflection film coating consisting of an SiO$_2$/TiO$_2$ multilayer is formed on the facets of the optical resonator of the LD. Further, Cr/Au is evaporated onto the rear surface of the LD chip, and it is then die-bonded onto a heat-sink consisting of a block of such material as Cu or diamond, which have high thermal conductivities, using an AuSn eutectic solder.

The GaN-based LD described in this embodiment was tested in terms of continuous operation at room temperature and had a threshold current of 80 mA. The operation wavelength was 420 nm, the operation voltage was 5V, and the life time, at 50° C. and 30 mW operation, was 5000 hours or longer.

FIG. 20 shows the band structure of the GaN-based LD of the seventh embodiment. Since a p-In$_{0.05}$Al$_{0.2}$Ga$_{0.75}$N buffer layer 8a is incorporated in this LD, the forbidden band gap width can be increased, and thus the carrier overflow effect, in which electrons injected into the MQW active layer from the n-side overflow into the p-side, can be suppressed, thus making it possible to obtain a high light emission efficiency.

In this embodiment, the p-GaN guide layer 7 is formed, and the p-Al$_{0.15}$Ga$_{0.85}$N cladding layer 9 is formed on top of the p-In$_{0.05}$Al$_{0.2}$Ga$_{0.75}$N buffer layer 8a. Further, the growth temperature is increased at the hetero-interface between the p-Al$_{0.15}$Ga$_{0.85}$N cladding layer 9 and the p-In$_{0.05}$Al$_{0.2}$Ga$_{0.75}$N buffer layer 8a, so as to carry out the epitaxial growth without interruption. Using this technique, the defect density at the hetero-interface can be decreased significantly.

The following are the reasons for this. There are, the growth is carried out without interruption at the interface between the p-GaN guide layer 7 and the p-In$_{0.05}$Al$_{0.2}$Ga$_{0.75}$N buffer layer 8a, and the temperature is increased at the interface between the p-In$_{0.05}$Al$_{0.2}$Ga$_{0.75}$N buffer layer 8a and the p-AlGaN cladding layer 9 without any interruption of the epitaxial growth, thus making it possible to lower the formation of interface levels at both interfaces. Further, since the temperature is raised at the interface of the In$_{0.05}$Al$_{0.2}$Ga$_{0.75}$N layer 8a, which is stable at high temperature, the defect density can be significantly decreased.

Therefore, with the technique of this embodiment, the following advantage is gained over the conventional structure shown in FIG. 1. That is, the generation of an interface region 8 containing high defect densities non-uniformly formed in the portion of the interface between the guide layer 7 and the cladding layer 9, which is located above the active layer, can be suppressed. Therefore, uniform carrier injection is achieved in the LD resonator. Further, as the non-uniform resistance, which results at interfaces when the growth is interrupted, is reduced, the operation voltage for the LD can be reduced.

Figure 21:
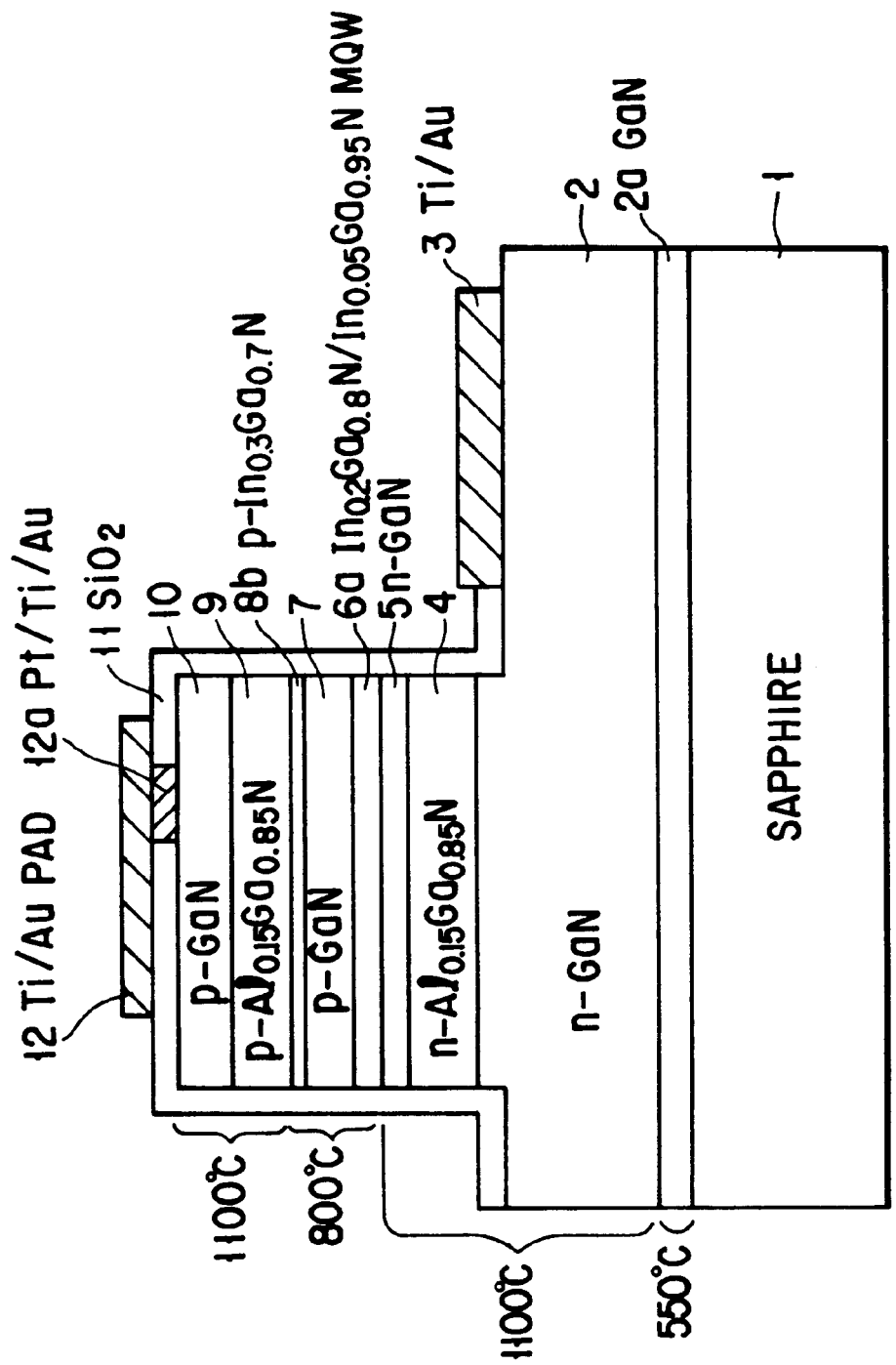
FIG. 21 is a cross sectional view of a GaN-based semiconductor light emitting device according to the eighth embodiment of the present invention.

The eighth embodiment of the present invention will now be described with reference to FIG. 21. FIG. 21 is a schematic view showing a cross section of the structure of a GaN-based LD according to this embodiment.

This embodiment is different from the seventh embodiment in the following respects. That is, the doping concentration of the Si impurity in the n-Al$_{0.15}$Ga$_{0.85}$N cladding layer 4 of the lower section is 5×10$^{17}$ cm$^{-3}$; the active layer 6a consists of a ten layer In$_{0.2}$Ga$_{0.8}$N quantum wells (undoped, 2.5 nm) and In$_{0.05}$Ga$_{0.95}$N barriers (undoped, thickness of 5 nm) which interpose these ten layers between them; and the buffer layer 8b is made of p-In$_{0.3}$Ga$_{0.7}$N (Mg doped, 1×10$^{18}$ cm$^{-3}$, thickness of 0.1 μm).

In the case where p-In$_{0.3}$Ga$_{0.7}$N is used as the buffer layer 8b, it is not necessary, during the growth of the p-Al$_{0.15}$Ga$_{0.85}$N cladding later 9 on the buffer layer 8b, to interrupt the epitaxial growth when the temperature is increased for the same reason as that of the seventh embodiment. Therefore, the defect density at the hetero-interface can be reduced. The manufacturing process of this embodiment is similar to that of the seventh embodiment. It should be noted that in the seventh and eighth embodiments, the epitaxial growth was carried out with the use of, not H$_2$, but N$_2$ as a carrier gas.

The GaN-based LD described in this embodiment was tested in terms of continuous operation at room temperature and had a threshold current of 85 mA. The operation wavelength was 420 nm, the operation voltage was 5.1V, the life time at 30° C. and 30 mW operation, was 5000 hours or longer, and the relative noise intensity in a temperature range from 20° C. to 70° C. was lower than 140 dB/Hz.

As in the case of the seventh embodiment, the LD of the eighth embodiment reduces non-radiative recombination, which is caused by the deep level defects generated at the interfaces in the conventional case, and therefore the hole injection efficiency for the MQW can be enhanced. In addition, the p-In$_{0.3}$Ga$_{0.7}$N buffer layer 8b of this embodiment has a higher In content than that of the wells in the MQW, and a narrower forbidden band gap width, therefore, it can serve also as a saturable absorption material. Consequently, as the saturable absorption material generates a self-oscillation, an excellent low noise performance can be achieved.

The LD of the eighth embodiment is capable of a uniform carrier injection into the LD resonator, and therefore not only it is able to reduce the resistive component of the LD, but also the buffer layer thereof serves as a saturable absorption material. Consequently, the LD can achieve an excellent low noise performance, such as that required for light sources for optical disks.

Further, the seventh and eighth embodiments are described in connection with the case where the InAlGaN or InGaN buffer layer is formed between the GaN guide layer and AlGaN cladding layer, but the buffer layer may also be made of In$_x$Al$_y$Ga$_z$B$_{1-x-y-z}$ (0≦x, y, z≦1, 0≦x+y+z≦1), and may also be formed between the active layer and the cladding layer.

It should be noted that the present invention is not limited to the above-described embodiments. These embodiments were described all in connection with examples of blue LD's and blue-green high luminescent LED's, formed on sapphire substrates. However, the present invention can be applied to the formation of LD's or LED's formed on any conductive substrate such as SiC or the like. Further, the present invention is applicable not only to a semiconductor light emitting device such as an LD or LED, but also to a GaN-based photodetector, transistor or the like. Further, in the general case of the formation a multilayer structure of a semiconductor device which involves a plurality of steps for increasing and decreasing the temperature, the use of the present invention can be expanded to any such a technical field.

Apart from the above, the present invention can be modified into various versions as long as the essence of the invention remains.

As described above, according to the method of manufacturing a semiconductor light emitting device, according to the present invention, the growth conditions for forming a multilayer structure, after the formation of the active layer, that is, the growth temperature, the type and flow rate of carrier gas, the pressure in the growth chamber, the flow rate of $NH_3$ and the like, and the points where these conditions are switched, are appropriately selected. Thus, the defect density can be decreased, the efficiency of the GaN-based semiconductor light emitting device can be improved, and the threshold current can be reduced. Consequently, a GaN-based semiconductor light emitting device having a low power consumption, a high output and a high reliability can be obtained.

Further, when the structure and growth conditions for the GaN-based semiconductor light emitting device are selected such that an interface region containing a particularly high density of defects is formed, an excellent current constriction structure, containing GaN as a structural element, can be formed.

Further, in the semiconductor light emitting device according to the present invention, an InAlGaN buffer layer containing an In element is formed continuously on an active layer, at the same temperature for forming the active layer, and an AlGaN cladding layer of the same conduction type as that of the InAlGaN buffer layer, continuously formed at a higher temperature, is constructed. With this structure, defects created between the cladding layer and the active layer, and the resistance which depends upon such defects, can be decreased. Furthermore, when the In content of the buffer layer is increased to make it serve as a saturable absorption material, a low noise light source for optical disks can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor light emitting device having a multilayer structure including at least an active layer, a guide layer and a cladding layer, said method comprising the steps of:

selecting a temperature from growth conditions for the multilayer structure; and beginning growth of said cladding layer at a first temperature, then switching said temperature from the first temperature to a second temperature before the end of growth of said cladding layer made of $In_xAl_yGa_zB_{1-x-y-z}N$ ($0 \leq x,y,z \leq 1$, $0 \leq x+y+z \leq 1$).

2. A method of manufacturing a semiconductor light emitting device according to claim 1, said method comprising the steps of:

selecting a pressure of a growth chamber from said growth conditions for the multilayer structure; and beginning growth of said cladding layer at a first pressure, then switching said pressure from the first pressure to a second pressure before the end of growth of said cladding layer made of $In_xAl_yGa_zB_{1-x-y-z}N$ ($0 \leq x,y,z \leq 1$, $0 \leq x+y+z \leq 1$).

3. A method of manufacturing a semiconductor light emitting device according to claim 1, said method comprising the steps of:

selecting a species of carrier gas and a flow rate thereof, from said growth conditions for the multilayer structure, the species of said carrier gas being a first or second carrier gas consisting of some mixture of hydrogen and nitrogen; and beginning growth of said cladding layer at a first flow rate of the first carrier gas, then switching said carrier gas from the first carrier gas at the first flow rate to one of the first and second carrier gases at a second flow rate before the end of growth of said cladding layer made of $In_xAl_yGa_zB_{1-x-y-z}N$ ($0 \leq x,y,z \leq 1$, $0 \leq x+y+z \leq 1$).

4. A method of manufacturing a semiconductor light emitting device according to claim 1, said method comprising the steps of:

selecting a species of source gas and a flow rate thereof, from said growth conditions for the multilayer structure, the species of said carrier gas being ammonia; and beginning growth of said cladding layer at a first flow rate of ammonia, then switching said flow rate of ammonia from first flow rate to a second flow rate before the end of growth of said cladding layer made of $In_xAl_yGa_zB_{1-x-y-z}N$ ($0 \leq x,y,z \leq 1$, $0 \leq x+y+z \leq 1$).

5. A method of manufacturing a semiconductor light emitting device having a multilayer structure including at least an active layer, a guide layer and a cladding layer, said method comprising the steps of:

selecting a temperature from growth conditions for the multilayer structure; and beginning growth of said guide layer at a first temperature, then switching said temperature from the first temperature to a second temperature before the end of growth of said guide layer made of $In_xAl_yGa_zB_{1-x-y-z}N$ ($0 \leq x,y,z \leq 1$, $0 \leq x+y+z \leq 1$).

6. A method of manufacturing a semiconductor light emitting device according to claim 5, said method comprising the steps of:

selecting a pressure of a growth chamber from said growth conditions for the multilayer structure; and beginning growth of said guide layer at a first pressure, then switching said pressure from the first pressure to a second pressure before the end of growth of said guide layer made of $In_xAl_yGa_zB_{1-x-y-z}N$ ($0 \leq x,y,z \leq 1$, $0 x+y+z \leq 1$).

7. A method of manufacturing a semiconductor light emitting device according to claim 5, said method comprising the steps of:

selecting a species of carrier gas and a flow rate thereof, from said growth conditions for the multilayer structure, the species of said carrier gas being a first or second carrier gas consisting of some mixture of hydrogen and nitrogen; and beginning growth of said guide layer at a first flow rate of the first carrier gas, then switching said carrier gas from the first carrier gas at first flow rate to one of the first and second carrier gases at a second flow rate before the end of growth of said guide layer made of $In_xAl_yGa_zB_{1-x-y-z}N$ ($0 \leq x,y,z \leq 1$, $0 \leq x+y+z \leq 1$).

8. A method of manufacturing a semiconductor light emitting device according to claim 5, said method comprising the steps of:

selecting a species of source gas and a flow rate thereof, from said growth conditions for the multilayer structure, the species of said carrier gas being ammonia; and beginning growth of said guide layer at a first flow rate of ammonia, then switching said flow rate of ammonia from the first flow rate to a second flow rate before the end of growth of said guide layer made of $In_xAl_yGa_zB_{1-x-y-z}N$ ($0-x,y,z \leq 1$, $0 \leq x+y+z \leq 1$).

9. A method of manufacturing a semiconductor light emitting device having a multilayer structure including at least an active layer, a guide layer, a cladding layer and a contact layer, said method comprising the steps of:

selecting a temperature from growth conditions for the multilayer structure; and switching said temperature from a first temperature to a second temperature in an interface between said cladding layer made of $In_xAl_yGa_zB_{1-x-y-z}N$ ($0 \leq x, y, z \leq 1$, $0 \leq x+y+z \leq 1$), and said contact layer made of $In_uAl_vGa_wB_{1-u-v-w}N$ ($0 \leq u, v, w \leq 1$, $0 \leq u+v+w \leq 1$).

10. A method of manufacturing a semiconductor light emitting device according to claim 9, said method comprising the steps of:

selecting a pressure of a growth chamber from said growth conditions for the multilayer structure; and switching said pressure from a first pressure to a second pressure in an interface between said cladding layer made of $In_xAl_yGa_zB_{1-x-y-z}N$ ($0 \leq x, y, z \leq 1$, $0 \leq x+y+z \leq 1$), and said contact layer made of $In_uAl_vGa_wB_{1-u-v-w}N$ ($0 \leq u, v, w \leq 1$, $0 \leq u+v+w \leq 1$).

11. A method of manufacturing a semiconductor light emitting device according to claim 9, said method comprising the steps of:

selecting a species of carrier gas and a flow rate thereof, from said growth conditions for the multilayer structure, the species of said carrier gas being a first or second carrier gas consisting of a mixture of hydrogen and nitrogen; and switching said carrier gas from the first carrier gas at a first flow rate to one of the first and second carrier gases at a second flow rate in an interface between said cladding layer made of $In_xAl_yGa_zB_{1-x-y-z}N$ ($0 \leq x, y, z \leq 1$, $0 \leq x+y+z \leq 1$), and said contact layer made of $In_uAl_vGa_wB_{1-u-v-w}N$ ($0 \leq u, v, w \leq 1$, $0 \leq u+v+w \leq 1$).

12. A method of manufacturing a semiconductor light emitting device according to claim 9, said method comprising the steps of:

selecting a species of source gas and a flow rate thereof, from said growth conditions for the multilayer structure, the species of said carrier gas being ammonia; and switching said flow rate of ammonia from a first flow rate to a second flow rate in an interface between said cladding layer made of $In_xAl_yGa_zB_{1-x-y-z}N$ ($0 \leq x, y, z \leq 1$, $0 \leq x+y+z \leq 1$), and said contact layer made of $In_uAl_vGa_wB_{1-u-v-w}N$ ($0 \leq u, v, w \leq 1$, $0 \leq u+v+w \leq 1$).

13. A method of manufacturing a semiconductor light emitting device having a multilayer structure including at least an active layer, upper and lower guide layers, a buffer layer and upper and lower cladding layers, said method comprising the steps of:

selecting a temperature from growth conditions for the multilayer structure;

beginning growth of the active layer and the upper guide layer at a first temperature, then growing said buffer layer made of $In_xAl_yGa_zB_{1-x-y-z}N$ ($0 \leq x,y,z \leq 1$, $0 \leq x+y+z \leq 1$) at the first temperature, then switching said temperature from the first temperature to a second temperature; and growing said upper cladding layer made of $In_uAl_vGa_wB_{1-u-v-w}N$ ($0 \leq u,v,w \leq 1$, $0 \leq u+v+w \leq 1$).

14. A method of manufacturing a semiconductor light emitting device according to claim 1, comprising:

beginning growth of said cladding layer at said first temperature;

growing a portion of said cladding layer at said first temperature;

switching said pressure from said first temperature to said second temperature after growing said portion; and growing a remaining portion of said cladding layer at said second temperature.

15. A method of manufacturing a semiconductor light emitting device according to claim 1, comprising:

beginning growth of said cladding layer at said first temperature at a first time corresponding to an interface with a directly underlying layer;

switching said temperature from said first temperature to said second temperature at a second time after said first time; and growing a remaining portion of said cladding layer at said second temperature.

16. A method of manufacturing a semiconductor light emitting device according to claim 5, comprising:

beginning growth of said guide layer at said first temperature;

growing a portion of said guide layer at said first temperature;

switching said pressure from said first temperature to said second temperature after growing said portion; and growing a remaining portion of said guide layer at said second temperature.

17. A method of manufacturing a semiconductor light emitting device according to claim 5, comprising:

beginning growth of said guide layer at said first temperature at a first time corresponding to an interface with a directly underlying layer;

switching said temperature from said first temperature to said second temperature at a second time after said first time; and growing a remaining portion of said guide layer at said second temperature.

18. A method of manufacturing a semiconductor light emitting device according to claim 13, wherein said buffer layer is an overflow suppression layer.

19. A method of manufacturing a semiconductor light emitting device according to claim 13, wherein said buffer layer is made of saturable absorption material.

* * * * *

UNITED STATES PATENT AND TRADEMARK OFFICE
CERTIFICATE OF CORRECTION

PATENT NO.   : 6,060,335
DATED        : MAY 9, 2000
INVENTOR(S)  : JOHN RENNIE ET AL.

It is certified that error appears in the above-identified patent and that said Letters Patent is hereby corrected as shown below:

In column 22 (Claim 14), line 25, change "pressure" to --temperature--.

In column 22 (Claim 16), line 46, change "pressure" to --temperature--.

Signed and Sealed this

Tenth Day of April, 2001

*Attest:*

NICHOLAS P. GODICI

*Attesting Officer*      *Acting Director of the United States Patent and Trademark Office*